(12) United States Patent
Sakai

(10) Patent No.: US 8,294,185 B2
(45) Date of Patent: Oct. 23, 2012

(54) SOLID-STATE IMAGING DEVICE

(75) Inventor: Chiaki Sakai, Kanagawa (JP)

(73) Assignee: Sony Corporation (JP)

( * ) Notice: Subject to any disclaimer, the term of this patent is extended or adjusted under 35 U.S.C. 154(b) by 364 days.

(21) Appl. No.: 12/658,714

(22) Filed: Feb. 12, 2010

(65) Prior Publication Data

US 2010/0214457 A1 Aug. 26, 2010

(30) Foreign Application Priority Data

Feb. 20, 2009 (JP) ................ P2009-037556

(51) Int. Cl.
*H01L 21/8238* (2006.01)

(52) U.S. Cl. ........ 257/225; 257/231; 257/292; 257/913; 257/E31.097

(58) Field of Classification Search .............. 257/184, 257/187, 225, 231, 291–292, 440, 913; 438/48–52, 438/58, 60
See application file for complete search history.

(56) References Cited

U.S. PATENT DOCUMENTS

| 7,294,873 B2 * | 11/2007 | Suzuki et al. ............ 257/225 |
| 7,459,735 B2 | 12/2008 | Ezaki et al. |
| 2008/0217724 A1 * | 9/2008 | Uya .......................... 257/460 |

FOREIGN PATENT DOCUMENTS

| JP | 2003-031785 A | 1/2003 |
| JP | 2005-294705 A | 10/2005 |

* cited by examiner

*Primary Examiner* — Dung A. Le
(74) *Attorney, Agent, or Firm* — Lerner, David, Littenberg, Krumholz & Mentlik, LLP

(57) ABSTRACT

A solid-state imaging device includes: a photoelectric conversion portion that receives an incident light from a back surface side of a silicon layer to perform photoelectric conversion on the incident light; and a pixel transistor portion that outputs signal charges generated in the photoelectric conversion portion towards a front surface side of the silicon layer, wherein a gettering layer having internal stress is provided on the front surface side of the silicon layer at a position to overlap the photoelectric conversion portion on a plan view layout thereof.

5 Claims, 17 Drawing Sheets

FIG.3
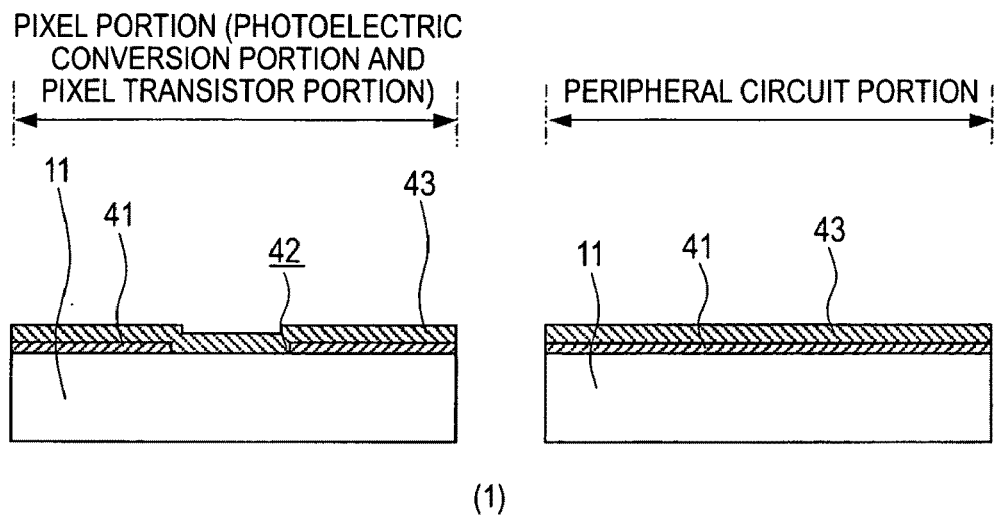
(1)
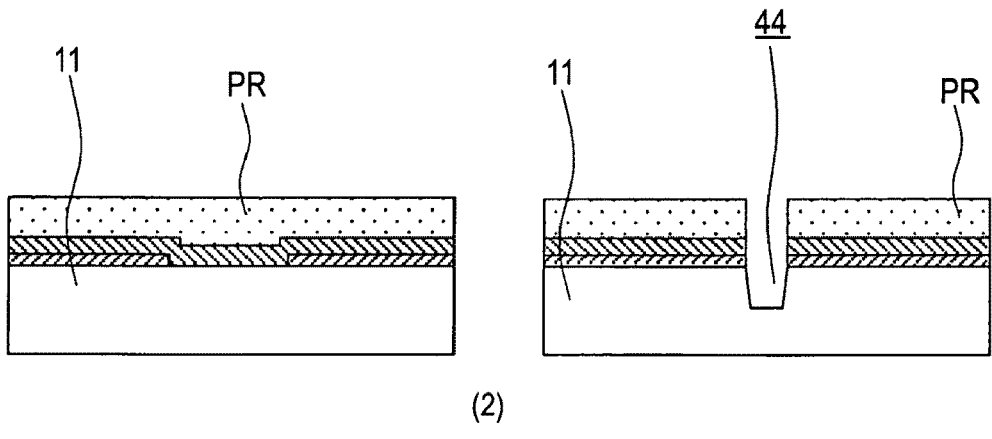
(2)
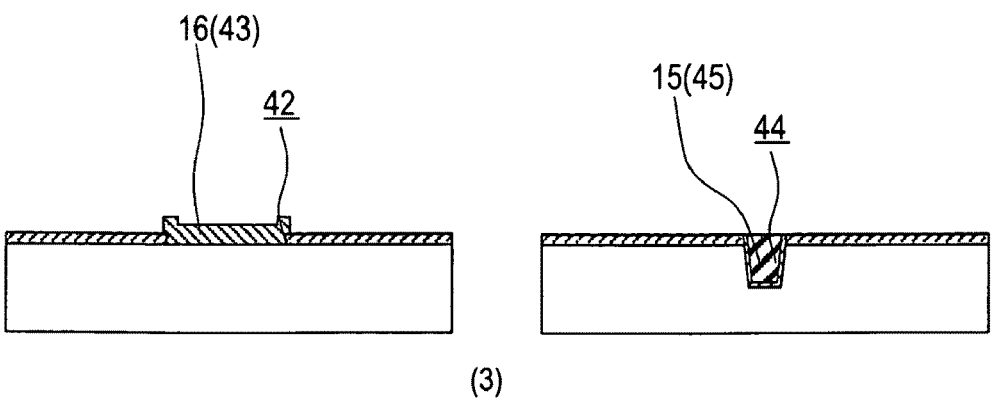
(3)

FIG.5
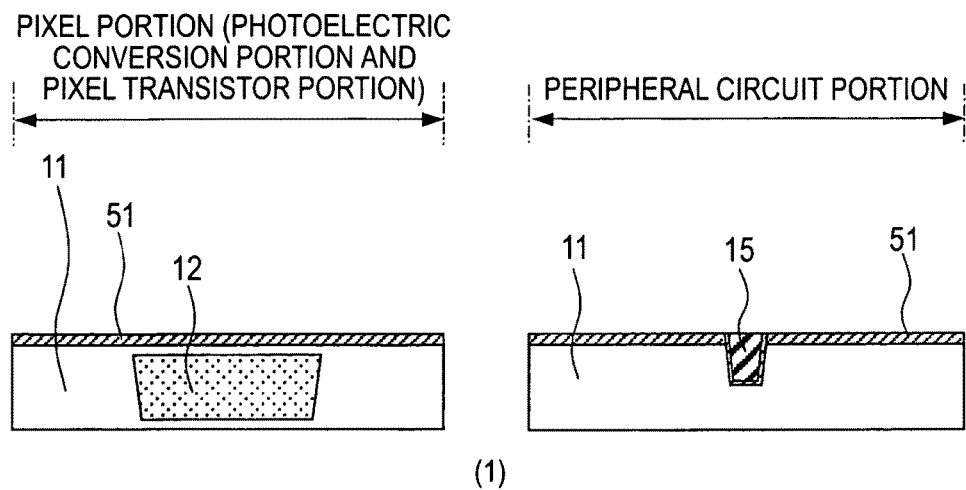
(1)
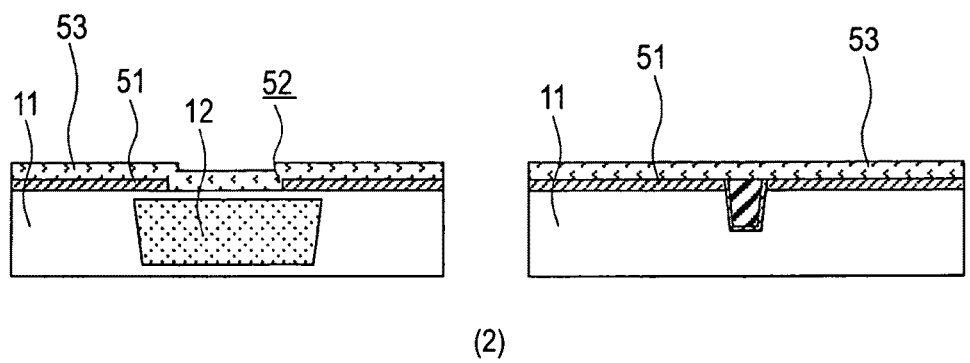
(2)
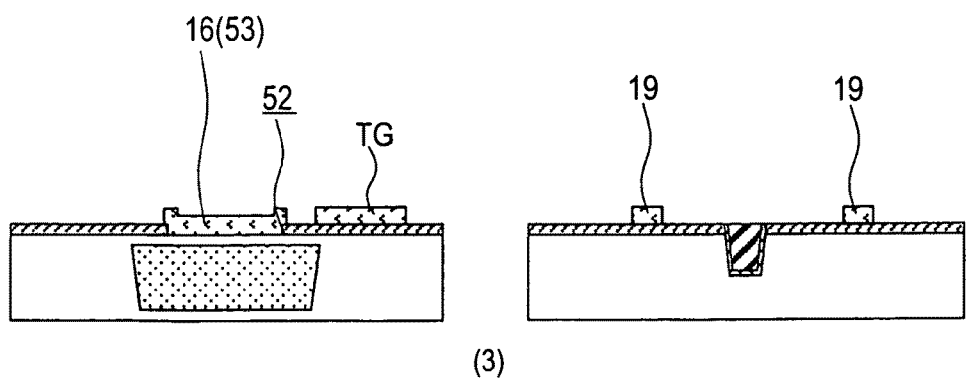
(3)

FIG.7
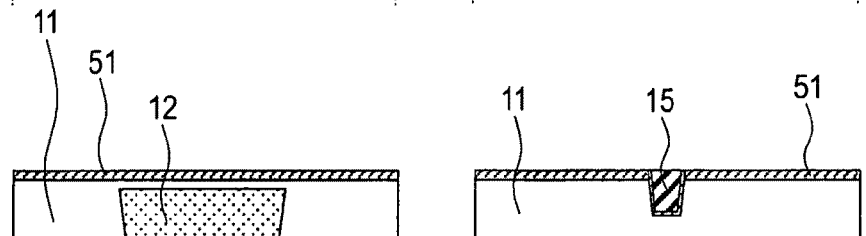
(1)
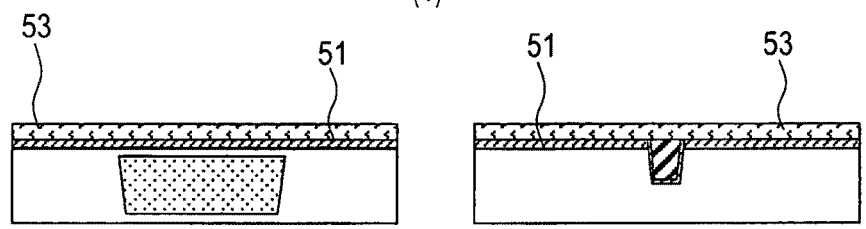
(2)
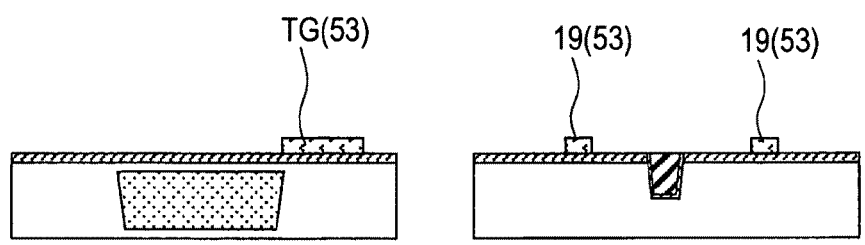
(3)
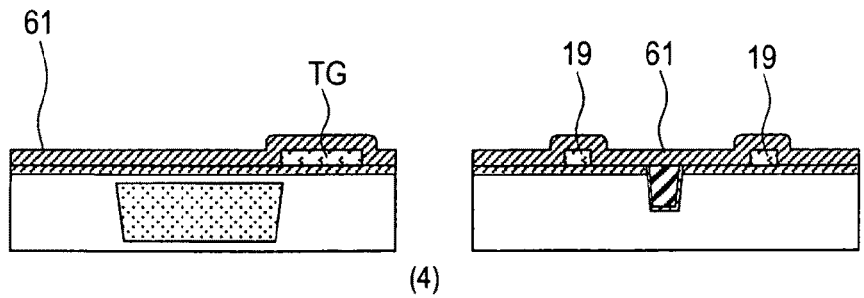
(4)
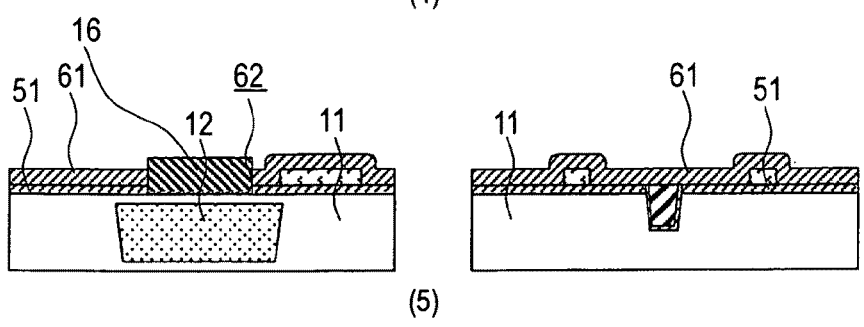
(5)

SOLID-STATE IMAGING DEVICE

CROSS-REFERENCE TO RELATED APPLICATION

The present application claims priority from Japanese Patent Application No. JP JP 2009-037556 filed in the Japanese Patent Office on Feb. 20, 2009, the entire content of which is incorporated herein by reference.

BACKGROUND OF THE INVENTION

1. Field of the Invention

The present invention relates to a solid-state imaging device, a manufacturing method thereof, and an imaging apparatus using the solid-state imaging device.

2. Description of the Related Art

As a new structure of a solid-state imaging device, JP-A-2003-031785, for example, proposes a so-called back-illuminated image sensor that receives an incident light from a surface which is opposite to a surface on which pixel transistors, a peripheral circuit portion, and wiring layers are formed.

This structure eliminates a vignetting phenomenon of the incident light due to the wiring layers and thus can improve quantum efficiency of the incident light.

On the other hand, an image sensor is known having a structure such that a light receiving portion receives an incident light from a side thereof on which wiring layers are formed. However, such an image sensor has a limitation on applicable materials since it is necessary to secure a sufficient transmissivity at a desired wavelength range so that a loss of the incident light above a light incidence surface of the light receiving portion can be suppressed.

On the contrary, the back-illuminated image sensor has a structure such that, when the image sensor is actually operated, the layer that forms the wiring region is positioned on the back surface (rear surface) side relative to the light receiving portion. Therefore, the back-illuminated image sensor has an advantage of completely eliminating the limitation on applicable materials.

As a technique of a substrate for the back-illuminated image sensor, SOI (silicon on insulator) substrates are popular.

A specific example of the SOI substrate has a configuration that a single-crystalline silicon layer having a thickness of several μm and serving as an active layer is formed on a base substrate via a silicon oxide layer. The silicon oxide layer provides selectivity when the base substrate is removed at the time of forming the back-illuminated image sensor.

However, it is known that, since the image sensor is an analog device, imaging characteristics thereof are strongly influenced by unevenness in processing dimension of a film thickness or line width, PID, crystal quality, and other factors. Among these factors, the request for reduced noise components is particularly strong. Thus, suppression of metal contamination during wafer processing steps as well as securement of high-quality crystals are very important requirements.

However, the SOI substrate has a structure such that the active layer is formed by the single-crystalline silicon layer having a thickness of several μm as described above. Therefore, a defect-free zone, that is, a DZ (denuded zone) layer, which contributes to photoelectric conversion, occupies most areas of the active layer, and thus there is not enough area for a gettering layer.

Therefore, it is very difficult to suppress noise components due to metal contamination, which can be said to be the most important problem of an image sensor.

Next, a specific example of a gettering technique will be described.

In general, gettering sites are formed in a region away from an active layer in which devices are formed, in order to prevent characteristic deterioration. Specifically, gettering sites are formed inside a silicon (Si) substrate at a distance of several tens of μm from a back surface of the silicon substrate or an active layer.

Another requirement is that contaminated seeds are caused to reach gettering sites and be trapped there by a diffusion phenomenon which is expected to occur at the time of heat treatment during the manufacturing process.

Moreover, depending on a method used, it may be indispensable to consider a phenomenon that the requirements (contaminated seeds and crystal defects) determining the formation of gettering sites are extended (redistributed) by the heat treatment.

The SOI substrate is applicable to the image sensor having the known structure under the above-described limitations. Thus, it is considered difficult to apply a plurality of gettering techniques.

As illustrated in FIG. 16, a gettering technique is generally classified into an intrinsic gettering (IG) method and an extrinsic gettering (EG) method.

The intrinsic gettering method is a method in which oxygen existing in an oversaturated condition ($1 \times 10^{18}$ cm$^{-3}$) in a silicon (Si) substrate is precipitated to form gettering sinks, such as $SiO_2$ precipitates, dislocations, or stacking faults, only inside the wafer. The oxygen is diffused towards the outer side of the wafer surface to form a defect-free zone (DZ layer), and devices are formed in the defect-free zone.

The extrinsic gettering method includes a phosphorous gettering method that uses diffusion of phosphorous (P). This method uses misfit dislocations, which are formed by diffusing phosphorous (P) impurities to high concentration, as the gettering sinks. The extrinsic gettering method also includes a method of forming a heterogeneous film. This method uses stress-induced strains of a polysilicon or silicon nitride ($Si_3N_4$) film, which is different from a silicon (Si) substrate, as the gettering sinks.

The extrinsic gettering method also includes a method using ion implantation or laser irradiation. This method uses cracks, dislocations, or stacking faults, which are formed due to damage created by ion implantation or laser irradiation, as the gettering sinks. A so-called carbon gettering is one example of this method.

The extrinsic gettering method also includes a hydrochloric acid (HCl) gettering method. This method subjects a wafer to heat treatment in a gaseous atmosphere containing chlorine (Cl) to change heavy metal into volatile metal chlorides, thus removing the volatile metal chlorides from the wafer.

The phosphorous gettering method has several problems in terms of the ability to control with high accuracy the misfit dislocations to be formed in a region away from the active layer and the redistribution of the contaminated seeds during the heat treatment to be trapped properly. However, at the present moment of time, it is considered difficult to apply the phosphorous gettering method to gettering of the substrate for solid-state imaging devices.

Moreover, the HCl gettering method is considered difficult to apply to gettering of the substrate for solid-state imaging devices since its gettering effect is transient. Furthermore, the ion implantation/laser irradiation method is considered difficult to apply to gettering of the substrate for solid-state imaging devices since there is basically potential concern about the method redistributing contaminated materials.

On the other hand, as a carbon gettering method which exhibits excellent gettering ability for metallic contaminated seeds, JP-A-2005-294705, for example, proposes a method of selectively forming gettering sites. However, as illustrated in FIG. 17, this method may not eliminate the effect of carbons (C) that are diffused and redistributed by heat treatment after the gettering sites of carbons (C) are formed, which makes miniaturization difficult.

In addition, in the SOI substrate, a silicon oxide film formed by a thermal oxidation method is present between the silicon layer of the active layer and the base substrate. Due to presence of the silicon oxide film, when gettering sites are formed on the side of the base substrate, there is such a limitation that diffusion or trapping (gettering) of metallic contaminated seeds other than metal elements such as copper capable of diffusing in the silicon oxide film are inhibited by the silicon oxide film.

As described above, a gettering technique, which is effective for solid-state imaging devices (e.g., back-illuminated image sensors) using the SOI substrate, is not yet established at the present moment of time.

SUMMARY OF THE INVENTION

That is to say, existing gettering methods have not been found effective for use in a silicon layer of a solid-state imaging device using the SOI substrate.

It is therefore desirable to provide a technique capable of gettering contaminating metals of a silicon layer in a solid-state imaging device using silicon layers such as SOI substrates.

According to an embodiment of the present invention, there is provided a solid-state imaging device including: a photoelectric conversion portion that receives an incident light from a back surface side of a silicon layer to perform photoelectric conversion on the incident light; and a pixel transistor portion that outputs signal charges generated in the photoelectric conversion portion towards a front surface side of the silicon layer, in which a gettering layer having internal stress is provided on the front surface side of the silicon layer at a position to overlap the photoelectric conversion portion on a plan view layout in a substrate surface thereof.

In the solid-state imaging device, since the gettering layer having internal stress is formed on the front surface of the silicon layer, which is opposite to the back surface which is the light incidence side, at a position to overlap the photoelectric conversion portion, strains are provided to the silicon layer by the stress of the gettering layer. Strained layers which are formed due to the strains function as gettering sites, thus effectively gettering metal impurities, for example, in the silicon layer.

According to another embodiment of the present invention, there is provided a manufacturing method (first manufacturing method) of a solid-state imaging device, including the steps of: forming in a silicon layer, a photoelectric conversion portion that receives an incident light and performs photoelectric conversion on the incident light, a pixel transistor portion that outputs signal charges generated in the photoelectric conversion portion, and a peripheral circuit portion that is formed on the periphery of a pixel portion having the photoelectric conversion portion and the pixel transistor portion; and the following previous steps including, forming a first insulating film on the front surface of the silicon layer; forming an aperture portion exposing the silicon layer at a position such overlap a region of the first insulating film, in which the photoelectric conversion portion is formed; forming a gettering formation layer having internal stress on the first insulating film including an inside of the aperture portion; forming device separation grooves in the silicon layer so as to separate the photoelectric conversion portion, the pixel transistor portion, and the peripheral circuit portion, and then forming a second insulating film on the gettering layer so as to bury the device separation grooves; removing the second insulating film left on the gettering layer, thus forming device separation regions with the second insulating film remaining inside the device separation grooves; and performing patterning so that the gettering formation layer remains inside the aperture portion, thus forming a gettering layer.

In the first manufacturing method, the aperture portion exposing the silicon layer is formed at a position to overlap a region in which the photoelectric conversion portion is formed, and the gettering layer is formed in the aperture portion by the gettering formation layer having internal stress. Therefore, strains are provided to the silicon layer by the stress of the gettering layer. Strained layers which are formed due to the strains function as gettering sites, thus effectively gettering metal impurities, for example, in the silicon layer.

According to still another embodiment of the present invention, there is provided a manufacturing method (second manufacturing method) of a solid-state imaging device, including the steps of: forming a photoelectric conversion portion in a silicon layer, the photoelectric conversion portion obtaining signal charges by performing photoelectric conversion on an incident light; forming a pixel transistor portion and a peripheral circuit portion in the silicon layer, the pixel transistor portion outputting the signal charges generated in the photoelectric conversion portion, the peripheral circuit portion being formed on the periphery of a pixel portion having the photoelectric conversion portion and the pixel transistor portion; forming a gate insulating film of either a transistor of the pixel transistor portion or a transistor of the peripheral circuit portion on a front surface of the silicon layer, and then forming an aperture portion exposing the silicon layer at a position to overlap a region of the gate insulating film, in which the photoelectric conversion portion is formed; forming a gate electrode formation film serving as a gettering layer having internal stress on the gate insulating film including an inside of the aperture portion; and forming a gate electrode of at least one of the pixel transistor portion and the peripheral circuit portion with the gate electrode formation film and performing patterning so that the gate electrode formation film remains inside the aperture portion, thus forming a gettering layer.

In the second manufacturing method, the aperture portion exposing the silicon layer is formed at a position to overlap a region in which the photoelectric conversion portion is formed, and the gettering layer having internal stress is formed in the aperture portion. Therefore, strains are provided to the silicon layer by the stress of the gettering layer. Strained layers which are formed due to the strains function as gettering sites, thus effectively gettering metal impurities, for example, in the silicon layer.

According to yet another embodiment of the present invention, there is provided a manufacturing method (third manufacturing method) of a solid-state imaging device, including the steps of: forming a photoelectric conversion portion in a silicon layer, the photoelectric conversion portion obtaining signal charges by performing photoelectric conversion on an incident light; forming a pixel transistor portion and a peripheral circuit portion in the silicon layer, the pixel transistor portion outputting the signal charges generated in the photoelectric conversion portion, the peripheral circuit portion being formed on the periphery of a pixel portion having the photoelectric conversion portion and the pixel transistor portion; forming gate electrodes of a transistor of the pixel transistor portion and a transistor of the peripheral circuit portion on the silicon layer via a gate insulating film; and forming sidewalls on lateral walls of the gate electrodes, wherein the step of forming sidewalls includes the steps of: forming a sidewall formation film on the silicon layer so as to cover the gate electrodes; forming an aperture portion exposing the silicon layer at a position to overlap a region of the gate insulating film and the sidewall formation film, in which the photoelectric conversion portion is formed; and forming a gettering layer having internal stress on a portion of a front surface of the silicon layer disposed below the aperture portion.

In the third manufacturing method, the aperture portion exposing the silicon layer is formed at a position to overlap a region in which the photoelectric conversion portion is formed, and the gettering layer having internal stress is formed in the aperture portion. Therefore, strains are provided to the silicon layer by the stress of the gettering layer. Strained layers which are formed due to the strains function as gettering sites, thus effectively gettering metal impurities, for example, in the silicon layer.

According to still yet another embodiment of the present invention, there is provided a manufacturing method (fourth manufacturing method) of a solid-state imaging device, including the steps of: forming a photoelectric conversion portion in a silicon layer, the photoelectric conversion portion obtaining signal charges by performing photoelectric conversion on an incident light; forming a pixel transistor portion and a peripheral circuit portion in the silicon layer, the pixel transistor portion outputting the signal charges generated in the photoelectric conversion portion, the peripheral circuit portion being formed on the periphery of a pixel portion having the photoelectric conversion portion and the pixel transistor portion; forming gate electrodes of a transistor of the pixel transistor portion and a transistor of the peripheral circuit portion with a gate electrode formation film which is formed on the silicon layer via a gate insulating film, and forming a gettering layer having internal stress at a position on the gate insulating film so as to overlap a region in which the photoelectric conversion portion is formed; forming an insulating film so as to cover the gate electrodes and the gettering layer; and forming an electrode so as to penetrate through the insulating film and be connected to the gate electrodes and the gettering layer.

In the fourth manufacturing method, the gettering layer having internal stress is formed by the gate electrode formation film at a position on the gate insulating film so as to overlap a region in which the photoelectric conversion portion is formed. Therefore, strains are provided to the silicon layer by the stress of the gettering layer. Strained layers which are formed due to the strains function as gettering sites, thus effectively gettering metal impurities, for example, in the silicon layer.

According to further another embodiment of the present invention, there is provided an imaging apparatus including: a light-condensing optical unit that condenses an incident light; an imaging unit having a solid-state imaging device which receives the light condensed by the light-condensing optical unit and perform photoelectric conversion on the light; and a signal processing portion that processes signals having subjected the photoelectric conversion, the solid-state imaging device including: a photoelectric conversion portion that receives an incident light from a back surface side of a silicon layer to perform photoelectric conversion on the incident light; and a pixel transistor portion that outputs signal charges generated in the photoelectric conversion portion towards a front surface side of the silicon layer, wherein a gettering layer having internal stress is provided on the front surface side of the silicon layer at a position to overlap the photoelectric conversion portion on a plan view layout in a substrate surface thereof.

In the imaging apparatus, the solid-state imaging device used in the imaging unit is provided with the gettering layer having internal stress which is formed on the front surface of the silicon layer, which is opposite to the light incidence side on which the photoelectric conversion portion is formed. Therefore, metal contamination of the silicon layer in which the photoelectric conversion portion is formed is gettered on the side opposite to the light incidence side of the silicon layer, and thus metals which are contaminating materials are removed from the region in which the photoelectric conversion portion is formed. Accordingly, occurrence of noise components resulting from metal contamination can be suppressed.

In the solid-state imaging device according to the embodiment of the present invention, since the gettering sites are formed in the silicon layer in which the photoelectric conversion portion is formed, the metal impurities in the silicon layer can be gettered at the gettering sites. Thus, it is possible to provide an advantage that occurrence of noise resulting from the impurities can be suppressed. Accordingly, it is possible to obtain high-quality imaged images.

In the manufacturing method of the solid-state imaging device according to the embodiments of the present invention, since the gettering sites are formed in the silicon layer in which the photoelectric conversion portion is formed, the metal impurities in the silicon layer can be gettered into the gettering sites. Thus, it is possible to provide an advantage that occurrence of noise resulting from the impurities can be suppressed. Accordingly, it is possible to obtain high-quality imaged images.

In the imaging apparatus according to the embodiment of the present invention, since occurrence of noise resulting from metal contamination can be suppressed in the solid-state imaging device used in the imaging unit, the solid-state imaging device can provide images with few noise components. Thus, it is possible to provide an advantage that high-quality imaged images can be obtained.

BRIEF DESCRIPTION OF THE DRAWINGS

FIG. 3 is a cross-sectional view illustrating the manufacturing process of a first example of a solid-state imaging device manufacturing method according to a third embodiment of the present invention.

FIG. 5 is a cross-sectional view illustrating the manufacturing process of a second example of the solid-state imaging device manufacturing method according to the third embodiment of the present invention.

FIG. 7 is a cross-sectional view illustrating the manufacturing process of a third example of the solid-state imaging device manufacturing method according to the third embodiment of the present invention.

DESCRIPTION OF THE PREFERRED EMBODIMENTS

Hereinafter, best modes for carrying out the present invention (hereinafter referred to as embodiments) will be described.

1. First Embodiment

Exemplary Configuration of Solid-State Imaging Device

An exemplary configuration of a solid-state imaging device according to a first embodiment of the present invention will be described with reference to the cross-sectional view of FIG. 1.

Figure 1:
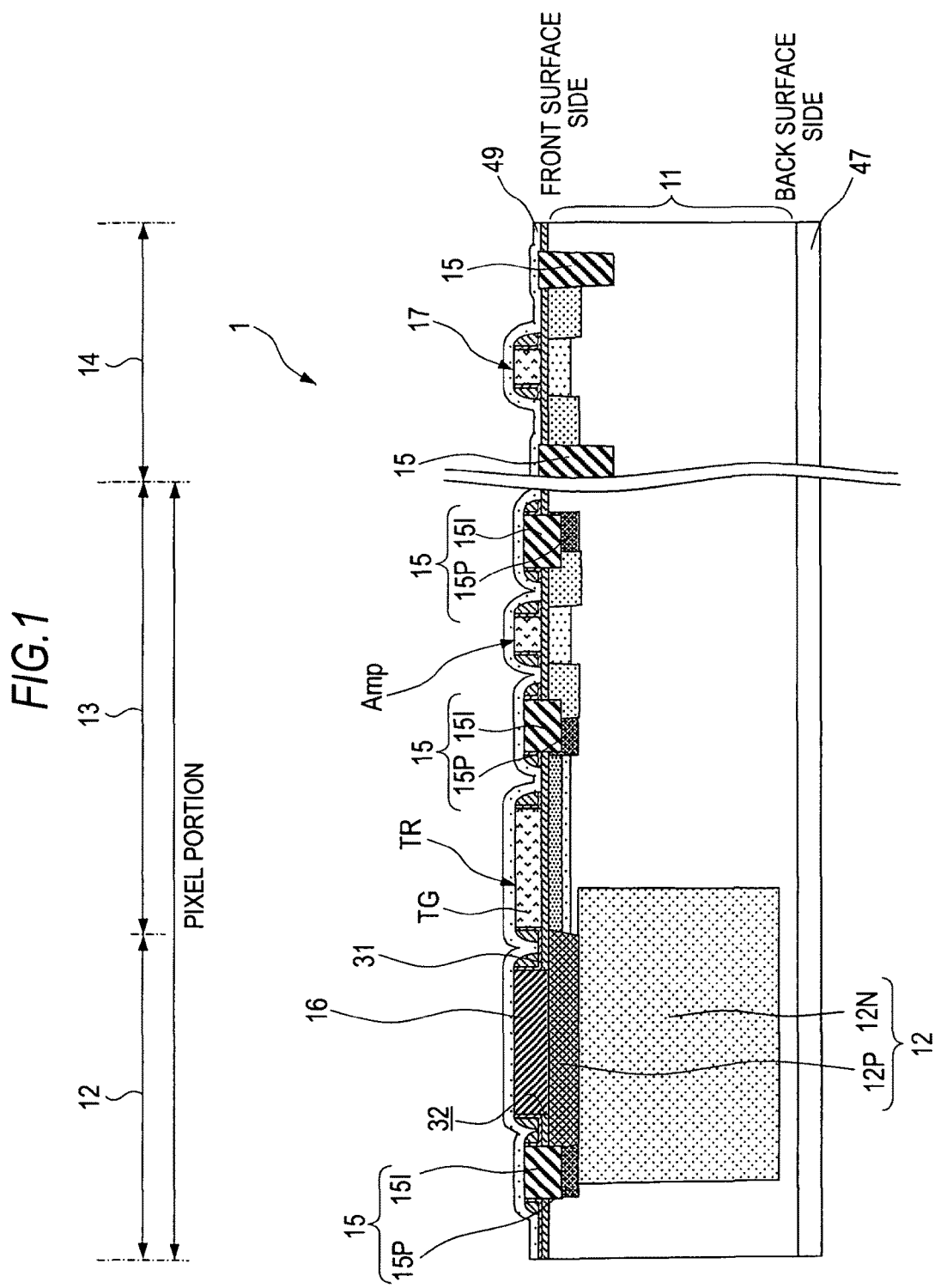
FIG. 1 is a schematic cross-sectional view illustrating an exemplary configuration of a solid-state imaging device according to a first embodiment of the present invention.

As illustrated in FIG. 1, a silicon layer 11 has formed therein a photoelectric conversion portion 12 that performs photoelectric conversion on an incident light received from a back surface side of the silicon layer 11 to obtain signal charges. A pixel transistor portion 13 that outputs the signal charges generated in the photoelectric conversion portion 12 is formed on a front surface side of the silicon layer 11. Moreover, a peripheral circuit portion 14 is formed on the periphery of a pixel portion having the photoelectric conversion portion 12 and the pixel transistor portion 13. In addition, device separation regions 15 are formed so as to isolate electrically the photoelectric conversion portion 12, the pixel transistor portion 13, and the peripheral circuit portion 14 from each other.

The silicon layer 11 is formed of a typical SOI substrate, for example. The photoelectric conversion portion 12 is configured by an N-type region 12N and a $P^+$-type region 12P formed thereon.

The device separation regions 15 have an STI (shallow trench isolation) structure, for example. Moreover, the device separation regions 15 of the pixel portion are formed of a P-type diffusion layer 15P and an insulating film (e.g., a silicon oxide film) 15I formed thereon. The insulating film 15I is formed to a thickness shallower than a thickness of the device separation region 15 formed in the peripheral circuit portion 14.

Furthermore, a gettering layer (an extrinsic gettering layer) 16 having internal stress is formed on the front surface side of the silicon layer 11 at a position to overlap the photoelectric conversion portion 12 on a plan view layout in a substrate surface thereof.

The gettering layer 16 is formed directly on the front surface of the silicon layer 11.

For example, when an insulating film 31 is formed on the front surface of the silicon layer 11, the gettering layer 16 is formed through an aperture portion 32 which is formed in the insulating film 31. For example, the insulating film 31 is formed by a gate insulating film of the pixel transistor portion 13 or a gate insulating film of the peripheral circuit portion 14, for example. Alternatively, the insulating film 31 may be formed by the gate insulating film of the pixel transistor portion 13 or the gate insulating film of the peripheral circuit portion 14 and an insulating film that forms sidewalls on the lateral walls of each gate electrode. Alternatively, the insulating film 31 may include another insulating film for other purposes, for example a protective film that covers transistors and the like for a protection purpose.

The gettering layer 16 is formed, for example, of a polysilicon film, a silicon nitride film, or the like. In the case of the polysilicon film or the silicon nitride film, the film is preferably formed by a reduced pressure CVD method.

A polysilicon film formed by the reduced pressure CVD method has an intrinsic stress value of about −200 MPa at a film thickness of 500 nm, for example. A silicon nitride film formed by the reduced pressure CVD method has an intrinsic stress value of about +1 GPa at a film thickness of 300 nm, for example. Therefore, the polysilicon film or the silicon nitride film will be a film having a sufficient tensile or compressive stress.

Furthermore, the gettering layer 16 may be an amorphous silicon film which is formed by a reduced pressure CVD method.

Furthermore, the gettering layer 16 may be a metal film. For example, a tungsten film or a tantalum film may be used. These films have a diffusion coefficient in single-crystalline silicon (Si), which is much (e.g., by several digits) lower than that of copper, cobalt, nickel, and the like, and have a diffusion coefficient which is also lower than that of molybdenum, titanium, chrome, nickel, ruthenium, and the like. Therefore, it can be said that substantially no tungsten or tantalum will diffuse into single-crystalline silicon.

Therefore, materials which have excellent heat resistance and a low diffusion coefficient and will not cause concern about metal contamination can be used for the gettering layer 16.

Moreover, the gettering layer 16 preferably has a large thickness from the perspective of applying stress to the front surface of the silicon layer 11. However, the gettering layer 16 preferably has a thickness equal to or smaller than the above-mentioned thickness due to potential problems such as cracks formed in the silicon layer 11 or self-destruction of the gettering layer 16, or limitations on the height of a stack structure of wiring layers or the like stacked on the gettering layer 16. That is to say, the polysilicon film formed by the reduced pressure CVD method is formed to a thickness of 500 nm or smaller, and the silicon nitride film formed by the reduced pressure CVD method is formed to a thickness of 300 nm or smaller.

The pixel transistor portion 13 includes a transfer transistor TR having a transfer gate TG for reading out signal charges from the photoelectric conversion portion 12, for example. The pixel transistor portion 13 further includes a pixel transistor array for amplifying and outputting the readout signal charges, the array including a reset transistor, an amplification transistor, and a select transistor, for example. In the drawing, among the transistors, only one transistor (e.g., an amplification transistor Amp) is illustrated as a representative example. Although the pixel transistor portion 13 is described as having the four transistors, a transfer transistor, a reset transistor, an amplification transistor, and a select transistor, the pixel transistor portion 13 may have only three transistors.

Moreover, although not illustrated in the drawing, the pixel transistor array including the reset transistor, the amplification transistor, and the select transistor may be provided as a common pixel transistor that is shared by two photoelectric conversion portions. Alternatively, the pixel transistor array may be provided as a common pixel transistor that is shared by four photoelectric conversion portions.

On the other hand, a transistor 17 is also formed in the peripheral circuit portion 14. Although only one transistor is depicted as a representative example in the drawing, the peripheral circuit portion 14 is configured by a plurality of transistors using NMOS transistors and PMOS transistors. In the case of a CMOS image sensor, for example, the peripheral circuit portion 14 includes driving circuits independently controlling control signal lines, and various circuits for pixel control such as, for example, a vertical scanning circuit, a timing generation circuit, and a horizontal scanning circuit.

Furthermore, although not illustrated in the drawing, a protective film 49 is formed on a portion of the front surface side of the silicon layer 11 on which the pixel transistor portion 13 and the peripheral circuit portion 14 are formed, and a plurality of wiring layers is formed on the protective film 49 via an interlayer insulating film. The front surface of the interlayer insulating film on the uppermost layer is planarized, and a support substrate is attached to the front surface. On the other hand, a protective film 47 is formed on the back surface side of the silicon layer 11, a color filter is formed at a position at which an incident light enters into the photoelectric conversion portion 12, and a microlens that guides the incident light towards the photoelectric conversion portion 12 is formed above the color filter. In this way, a solid-state imaging device 1 is formed.

In the solid-state imaging device 1, since the gettering layer 16 having internal stress is formed on the front surface of the silicon layer 11, which is opposite to the back surface which is the light incidence side, at a position to overlap the photoelectric conversion portion 12, strains are provided to the silicon layer 11 by the stress of the gettering layer 16. Strained layers which are formed due to the strains function as gettering sites, thus effectively gettering metal impurities, for example, in the silicon layer 11.

Moreover, since the gettering layer 16 is formed directly on the top surface of the silicon layer 11, the stress of the gettering layer 16 can be directly transmitted to the silicon layer 11. For this reason, the stress in the gettering layer 16 can be transmitted to the silicon layer 11 without loss, so that strains serving as gettering sites can be applied to the silicon layer 11.

Moreover, since the gettering layer 16 is formed on the front surface of the silicon layer 11, which is opposite to the side of the photoelectric conversion portion 12, on which the incident light is incident, the optical characteristics of the gettering layer 16 are not particularly limited. Therefore, a metal film having light shielding properties can also be used. That is to say, since the incident light is not absorbed in the gettering layer 16, it is possible to improve the quantum (photoelectric conversion) efficiency of the photoelectric conversion portion 12. Accordingly, it is possible to improve the sensitivity of the solid-state imaging device 1.

Furthermore, since formation of the gettering sites is achieved by the internal stress of the gettering layer 16, the gettering sites do not need to contain impurities to be used for gettering. Therefore, it is possible to prevent redistribution of impurities used for the gettering during a long period of heat treatment which is indispensable for gettering metal impurities. Furthermore, it is possible to form the gettering sites at a limited area in the silicon layer 11 and thus to secure a depletion layer area including the photoelectric conversion portion 12 in as wide a range of areas as possible. Therefore, improved sensitivity can be provided by forming the photoelectric conversion portion 12 in a wide range of areas. Moreover, it is possible to suppress characteristic variations.

2. Second Embodiment

Exemplary Configuration of Solid-State Imaging Device

An exemplary configuration of a solid-state imaging device according to a second embodiment of the present invention will be described with reference to the cross-sectional view of FIG. 2.

Figure 2:
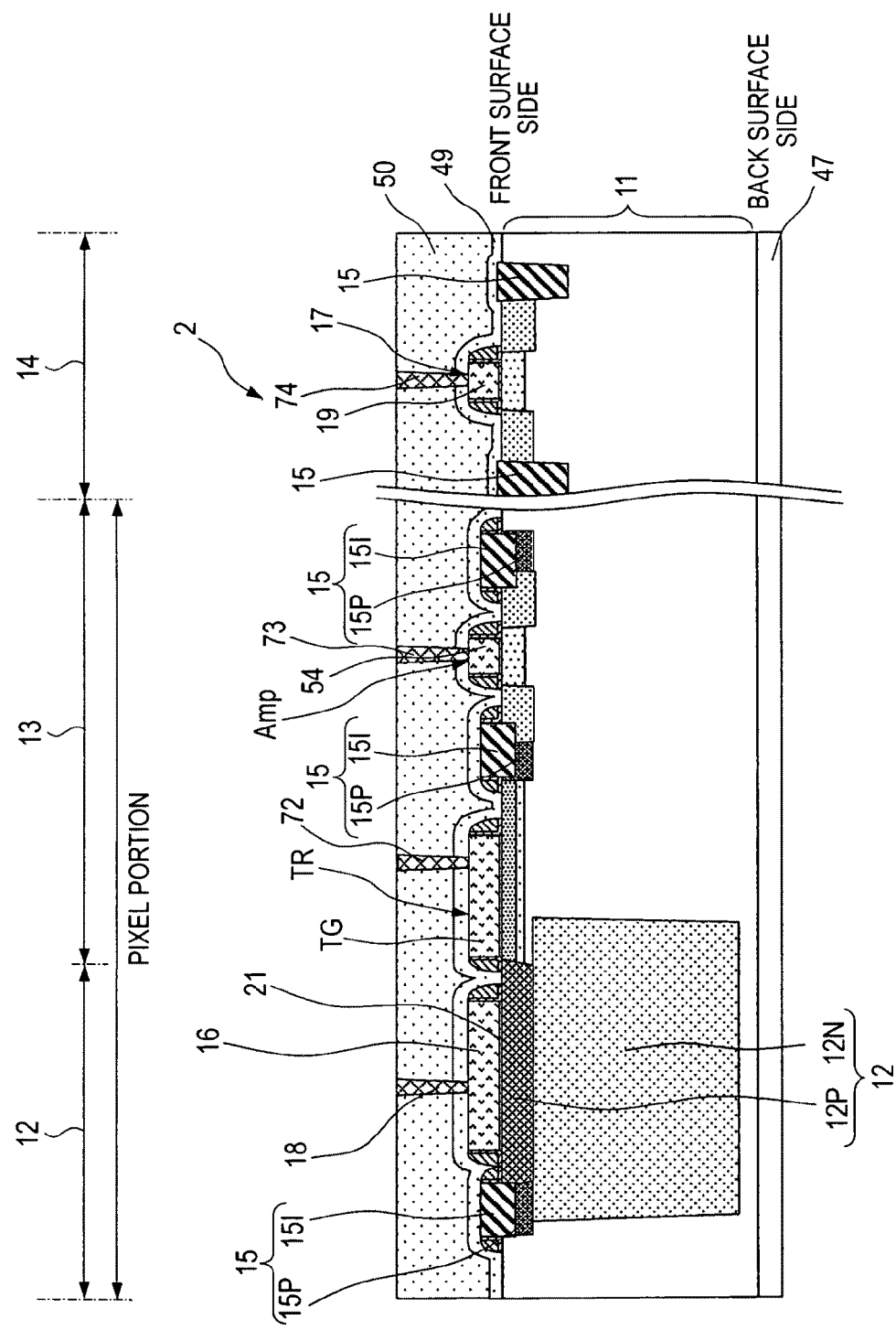
FIG. 2 is a schematic cross-sectional view illustrating an exemplary configuration of a solid-state imaging device according to a second embodiment of the present invention.

As illustrated in FIG. 2, a silicon layer 11 has formed therein a photoelectric conversion portion 12 that performs photoelectric conversion on an incident light received from a back surface side of the silicon layer 11 to obtain signal charges. A pixel transistor portion 13 that outputs the signal charges generated in the photoelectric conversion portion 12 is formed on a front surface side of the silicon layer 11. Moreover, a peripheral circuit portion 14 is formed on the periphery of a pixel portion having the photoelectric conversion portion 12 and the pixel transistor portion 13. In addition, device separation regions 15 are formed so as to isolate electrically the photoelectric conversion portion 12, the pixel transistor portion 13, and the peripheral circuit portion 14 from each other.

The silicon layer 11 is formed of a typical SOI substrate, for example. The photoelectric conversion portion 12 is configured by an N-type region 12N and a P$^+$-type region 12P formed thereon.

The device separation regions 15 have an STI (shallow trench isolation) structure, for example. Moreover, the device separation regions 15 of the pixel portion are formed of a P-type diffusion layer 15P and an insulating film (e.g., a silicon oxide film) 15I formed thereon. The insulating film 15I is formed to a thickness shallower than a thickness of the device separation region 15 formed in the peripheral circuit portion 14.

Furthermore, a gettering layer (an extrinsic gettering layer) 16 having internal stress is formed on the front surface side of the silicon layer 11 via a gate insulating film 21 at a position to overlap the photoelectric conversion portion 12 on a plan view layout in a substrate surface thereof.

The gate insulating film 21 is formed by a gate insulating film which is at the same layer as either a gate insulating film of the transistor of the pixel transistor portion 13 or a gate insulating film of the transistor of the peripheral circuit portion 14.

Therefore, the gettering layer 16 is formed by a polysilicon film which is at the same layer as a gate electrode 54 of the transistor (e.g., an amplification transistor Amp) of the pixel transistor portion 13 or a gate electrode 19 of a transistor 17 of the peripheral circuit portion 14, for example. In the case of the polysilicon film, the film is preferably formed by a reduced pressure CVD method.

A polysilicon film formed by the reduced pressure CVD method has an intrinsic stress value of about −200 MPa at a film thickness of 500 nm, for example.

Furthermore, the gettering layer 16 may be an amorphous silicon film which is formed by a reduced pressure CVD method.

Furthermore, the gettering layer 16 may be a metal film. For example, when the gate electrode 19 of the peripheral circuit portion 14 is formed of a metal film such as a tungsten film or a tantalum film, this metal film is used for the gettering layer 16. These films have a diffusion coefficient in single-crystalline silicon (Si), which is much (e.g., by several digits) lower than that of copper, cobalt, nickel, and the like, and have a diffusion coefficient which is also lower than that of molybdenum, titanium, chrome, nickel, ruthenium, and the like. Therefore, it can be said that substantially no tungsten or tantalum will diffuse into single-crystalline silicon.

Therefore, any conductive materials which have excellent heat resistance and a low diffusion coefficient and will not cause concern about metal contamination can be used for the gettering layer 16.

Moreover, the gettering layer 16 preferably has a large thickness from the perspective of applying stress to the front surface of the silicon layer 11. However, when the gettering layer 16 is formed at the same layer as a gate electrode, the gettering layer 16 may have the same thickness as the gate electrode.

The gettering layer 16 is connected to an electrode 18 for applying a negative voltage, for example. Moreover, a transfer gate TG, the gate electrodes 54 and 19, and the like are also connected to electrodes 72, 73, and 74.

The pixel transistor portion 13 includes a transfer transistor TR having a transfer gate TG for reading out signal charges from the photoelectric conversion portion 12, for example. The pixel transistor portion 13 further includes a pixel transistor array for amplifying and outputting the readout signal charges, the array including a reset transistor, an amplification transistor, and a select transistor, for example. In the drawing, among the transistors, only one transistor (e.g., an amplification transistor Amp) is illustrated as a representative example. Although the pixel transistor portion 13 is described as having the four transistors, a transfer transistor, a reset transistor, an amplification transistor, and a select transistor, the pixel transistor portion 13 may have only three transistors.

Moreover, although not illustrated in the drawing, the pixel transistor array including the reset transistor, the amplification transistor, and the select transistor may be provided as a common pixel transistor that is shared by two photoelectric conversion portions. Alternatively, the pixel transistor array may be provided as a common pixel transistor that is shared by four photoelectric conversion portions.

On the other hand, a transistor 17 is also formed in the peripheral circuit portion 14. Although only one transistor is depicted as a representative example in the drawing, the peripheral circuit portion 14 is configured by a plurality of transistors using NMOS transistors and PMOS transistors. In the case of a CMOS image sensor, for example, the peripheral circuit portion 14 includes driving circuits independently controlling control signal lines, and various circuits for pixel control such as, for example, a vertical scanning circuit, a timing generation circuit, and a horizontal scanning circuit.

Furthermore, although not illustrated in the drawing, a protective film 49 is formed on a portion of the front surface side of the silicon layer 11 on which the pixel transistor portion 13 and the peripheral circuit portion 14 are formed, and a plurality of wiring layers is formed on the protective film 49 via an interlayer insulating film. The electrode 18 is formed in an underlayer 50 of the interlayer insulating film. The front surface of the interlayer insulating film, which is the uppermost layer, is planarized, and a support substrate is attached to the front surface. In addition, a protective film 47 is formed on the back surface side of the silicon layer 11, a color filter is formed at a position at which an incident light enters into the photoelectric conversion portion 12, and a microlens that guides the incident light towards the photoelectric conversion portion 12 is formed above the color filter. In this way, a solid-state imaging device 2 is formed.

In the solid-state imaging device 2, since the gettering layer 16 having internal stress is formed on the front surface of the silicon layer 11, which is opposite to the back surface which is the light incidence side, at a position to overlap the photoelectric conversion portion 12, strains are provided to the silicon layer 11 by the stress of the gettering layer 16. Strained layers which are formed due to the strains function as gettering sites, thus effectively gettering metal impurities, for example, in the silicon layer 11.

Moreover, the gettering layer 16 is connected to the electrode 18 for applying a negative voltage. When a negative potential is applied to the gettering layer 16 through the electrode 18, holes can be electrically accumulated to a portion of the silicon layer 11 at the vicinity of the gettering layer 16, whereby a hole accumulation layer is formed. The formed hole accumulation layer prevents occurrence of white points in the photoelectric conversion portion 11 and generation of dark current. A voltage of around 1.1 to 1.2 V will suffice for application to the gettering layer 16.

Furthermore, since the gettering layer 16 is formed on the front surface of the silicon layer 11, which is opposite to the side of the photoelectric conversion portion 12, on which the incident light is incident, the optical characteristics of the gettering layer 16 are not particularly limited. Therefore, a metal film having light shielding properties can also be used.

Furthermore, since formation of the gettering sites is achieved by the internal stress of the gettering layer 16, the gettering sites do not need to contain impurities to be used for gettering. Therefore, it is possible to prevent redistribution of impurities used for the gettering during a long period of heat treatment which is indispensable for gettering metal impurities.

3. Third Embodiment

First Example of Solid-State Imaging Device Manufacturing Method

A first example of a solid-state imaging device manufacturing method according to a third embodiment of the present invention will be described with reference to the cross-sectional views of FIGS. 3 and 4.

According to the first example (first manufacturing method) of the solid-state imaging device manufacturing method, a photoelectric conversion portion that receives an incident light to perform photoelectric conversion on the incident light and a pixel transistor portion that outputs signal charges generated in the photoelectric conversion portion are formed in a silicon layer formed of a silicon substrate. At the same time, a peripheral circuit portion is formed in the silicon layer on the periphery of a pixel portion having the photoelectric conversion portion and the pixel transistor portion.

Prior to forming the photoelectric conversion portion, the pixel transistor portion, and the peripheral circuit portion, as illustrated in (1) in FIG. 3, a first insulating film 41 is formed on the front surface of a silicon layer 11 formed of a silicon substrate. The first insulating film 41 is formed, for example, of a silicon oxide film, and is a buffering layer for ion implantation, for example. Alternatively, the first insulating film 41 is a sacrificial layer used when forming device separation regions.

Subsequently, an aperture portion 42 exposing the silicon layer 11 is formed at a position to overlap a region of the first insulating film 41 in which the photoelectric conversion portion is formed.

Subsequently, a gettering formation layer 43 having internal stress is formed on the first insulating film 41 including an inside of the aperture portion 42. For example, the first insulating film 41 is formed of a silicon oxide film by a plasma CVD method that uses TEOS as raw material gas, for example. Moreover, the gettering formation layer 43 is formed of a silicon nitride film by a reduced pressure CVD method. For example, a silicon nitride film formed by the reduced pressure CVD method has an intrinsic stress value of about +1 GPa at a film thickness of 300 nm, for example.

Subsequently, as illustrated in (2) in FIG. 3, a resist mask PR, which is used when forming device separation grooves, is formed on the gettering formation layer 43 by general resist coating technique and lithography technique.

Subsequently, using the resist mask PR as an etching mask, device separation grooves 44 are formed in the silicon layer 11 so as to separate the photoelectric conversion portion, the pixel transistor portion, and the peripheral circuit portion from each other. Thereafter, the resist mask PR is removed. In the drawing, a state right before the resist mask PR is removed is illustrated.

Subsequently, as illustrated in (3) in FIG. 3, after oxidizing the inner walls of the device separation grooves 44, a second insulating film 45 is formed on the gettering formation layer 43 so as to bury the device separation grooves 44.

Next, the second insulating film 45 left on the gettering formation layer 43 is removed, thus forming device separation regions 15 with the second insulating film 45 remaining inside the device separation grooves 44.

Furthermore, patterning is performed by etching processing using a general resist mask (not illustrated) so that the gettering formation layer 43 remains inside the aperture portion 42, thus forming a gettering layer (extrinsic gettering layer) 16.

Figure 4:
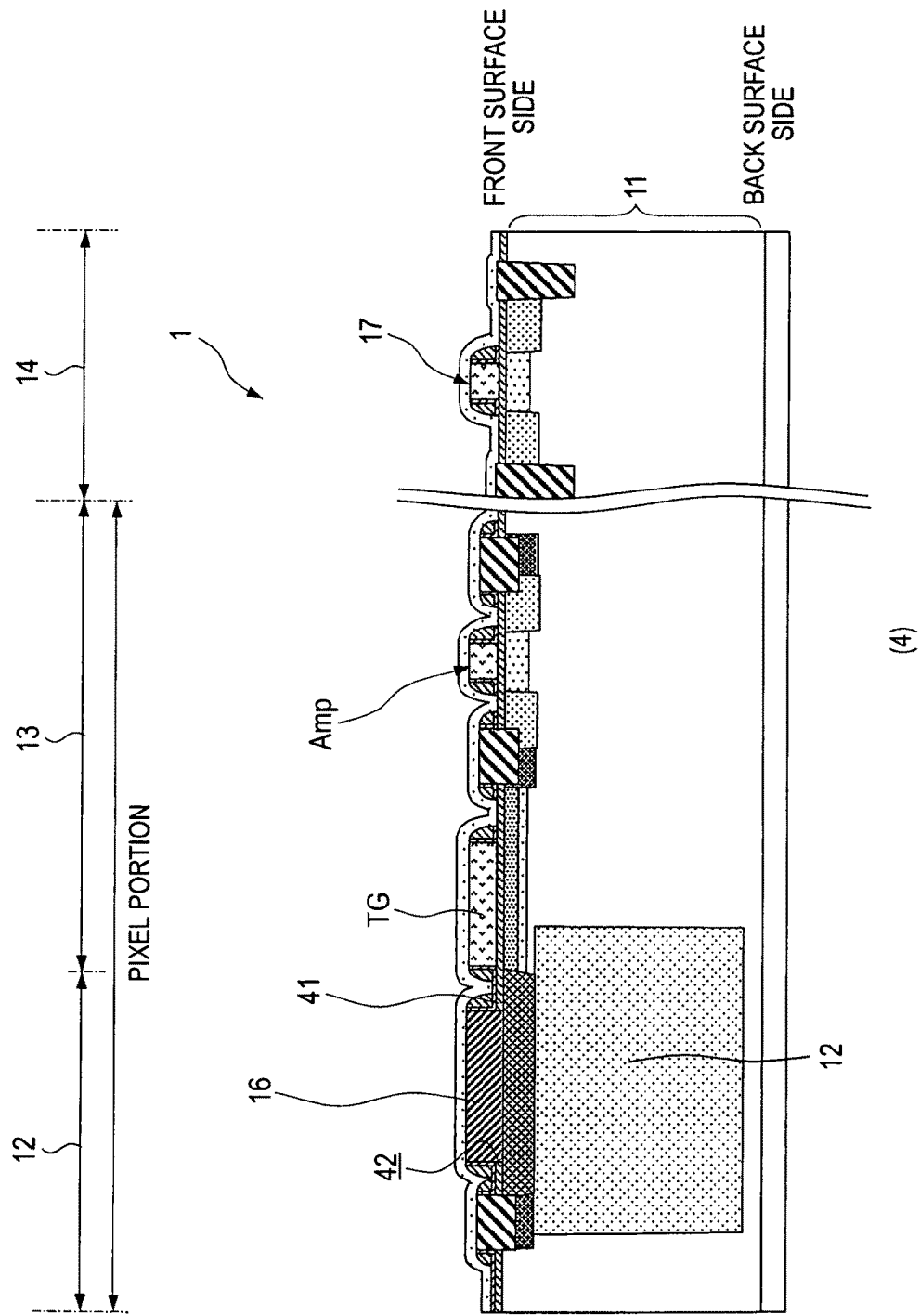
FIG. 4 is a cross-sectional view illustrating the manufacturing process of the first example of the solid-state imaging device manufacturing method according to the third embodiment of the present invention.

Subsequently, as illustrated in FIG. 4, the photoelectric conversion portion 12 is formed in the silicon layer 11. The formation step of the photoelectric conversion portion 12 may be performed prior to the step of forming the gettering layer 16. For example, the photoelectric conversion portion 12 may be formed before the aperture portion 42 is formed before or after the first insulating film 41 is formed. Furthermore, a transfer gate TG, a reset transistor (not illustrated), an amplification transistor Amp, and a select transistor (not illustrated) of the pixel transistor portion 13, a transistor 17 of the peripheral circuit portion 14, and the like are formed in the silicon layer 11.

Furthermore, although not illustrated in the drawing, a protective film 49 is formed on a portion of the front surface side of the silicon layer 11 on which the pixel transistor portion 13 and the peripheral circuit portion 14 are formed, and a plurality of wiring layers is formed on the protective film 49 via an interlayer insulating film. The front surface of the interlayer insulating film on the uppermost layer is planarized, and a support substrate is attached to the front surface. In addition, a protective film 47 is formed on the back surface side of the silicon layer 11, a color filter is formed at a position at which an incident light enters into the photoelectric conversion portion 12, and a microlens that guides the incident light towards the photoelectric conversion portion 12 is formed above the color filter. In this way, a solid-state imaging device 1 is formed.

In the first manufacturing method, the aperture portion 42 exposing the silicon layer 11 is formed at a position to overlap a region in which the photoelectric conversion portion 12 is formed, and the gettering layer 16 is formed by the gettering formation layer 43 having internal stress in the aperture portion 42. Therefore, strains are provided to the silicon layer 11 by the stress of the gettering layer 16. Strained layers which are formed due to the strains function as gettering sites, thus effectively gettering metal impurities, for example, in the silicon layer 11.

Moreover, the gettering layer 16 serves as a stopper when removing the second insulating film 45 that forms the device separation regions 15. That is to say, the gettering layer 16 can also be used as a stopper layer used when forming the device separation regions 15.

Furthermore, since an impurity introducing step or an annealing step that uses a furnace is additionally performed after the gettering layer 16 is formed, it is possible to expect an enhanced gettering effect due to diffusion of metal impurities in the silicon layer 11.

Second Example of Solid-State Imaging Device Manufacturing Method

Figure 6:
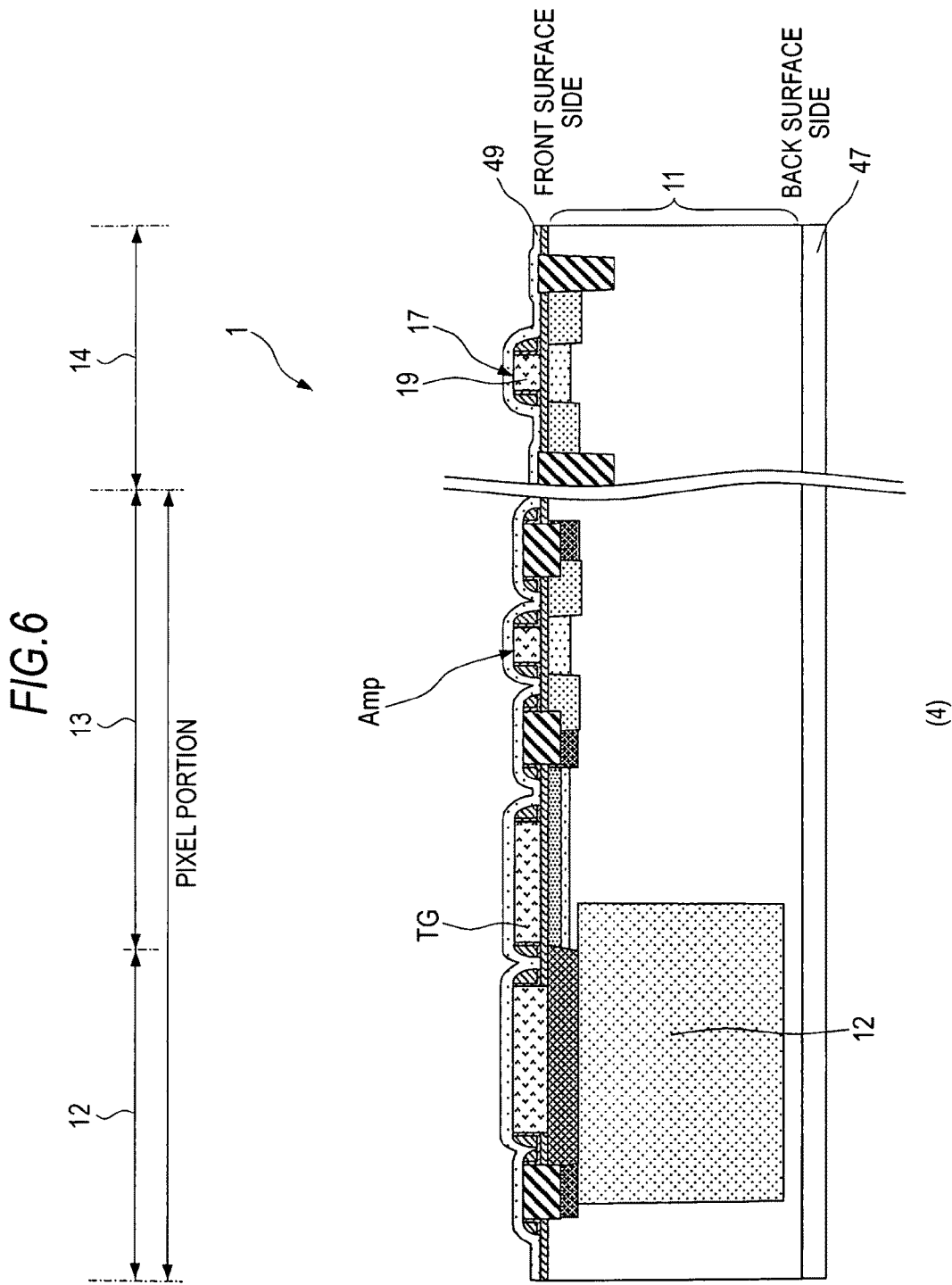
FIG. 6 is a cross-sectional view illustrating the manufacturing process of the second example of the solid-state imaging device manufacturing method according to the third embodiment of the present invention.

A second example of a solid-state imaging device manufacturing method according to a third embodiment of the present invention will be described with reference to the cross-sectional views of FIGS. 5 and 6.

According to the second example (second manufacturing method) of the solid-state imaging device manufacturing method, as illustrated in (1) in FIG. 5, device separation regions 15 are formed in a silicon layer 11 formed of a silicon substrate so as to isolate electrically devices which are formed in a photoelectric conversion portion, a pixel transistor portion, and a peripheral circuit portion.

Subsequently, a photoelectric conversion portion 12 that receives an incident light to perform photoelectric conversion on the incident light is formed in the silicon layer 11.

In addition, the second manufacturing method includes a step of forming in the silicon layer 11, a pixel transistor portion that outputs signal charges generated in the photoelectric conversion portion 12 and forming a peripheral circuit portion on the periphery of a pixel portion having the photoelectric conversion portion 12 and the pixel transistor portion.

After the photoelectric conversion portion 12 is formed, a gate insulating film 51 of either a transistor of the pixel transistor portion or a transistor of the peripheral circuit portion is formed on the front surface of the silicon layer 11. When it is desired to form a gate insulating film of a transistor of the pixel transistor portion or the peripheral circuit portion which requires a gate insulating film thicker than the gate insulating film 51, the gate insulating film may be formed in a separate step. Moreover, when the gate insulating film 51 is formed of a silicon oxide film, the gate insulating film may be formed to be thick. An example of this formation method will be described. In this case, the gate insulating film 51 is formed on portions of the silicon layer 11 requiring a thin gate insulating film, and the gate insulating film 51 on portions of the silicon layer 11 requiring a thick gate insulating film is further oxidized in a state of masking the portions requiring the thin gate insulating film, thus making the gate insulating film 51 on those portions thick.

Subsequently, as illustrated in (2) in FIG. 5, an aperture portion 52 exposing the silicon layer 11 is formed at a position to overlap a region of the gate insulating film 51 in which the photoelectric conversion portion 12 is formed. The formation step of the aperture portion 52 may be performed, for example, after an etching mask formed of a resist is formed on the gate insulating film 51 so that the aperture portion 52 is formed in the gate insulating film 51 by etching. Since the aperture portion 52 does not require such a higher degree of alignment accuracy as necessary for a gate electrode of a MOS transistor, an isotropic etching process, for example, which does not cause damage to an underlying layer, can be used.

Subsequently, gate electrode formation film 53, which serves as a gettering layer having internal stress, is formed on the gate insulating film 51 including an inside of the aperture portion 52. For example, the gate electrode formation film 53 is formed of a polysilicon film by a reduced pressure CVD method. For example, when the polysilicon film is formed of such a polysilicon film, the polysilicon film has a stress value of about −200 MPa, for example.

Subsequently, as illustrated in (3) in FIG. 5, gate electrodes of the pixel transistor portion and the peripheral circuit portion are formed by the gate electrode formation film 53. For example, a transfer gate TG of the pixel transistor portion, a gate electrode (not illustrated) of a reset transistor, and a gate electrode (not illustrated) of an amplification transistor are formed, and at the same time, a gate electrode 19 of a transistor of the peripheral circuit portion is formed. At the same time, patterning is performed so that the gate electrode formation film 53 remains inside the aperture portion 52, thus forming a gettering layer (extrinsic gettering layer) 16.

Subsequently, as illustrated in (4) in FIG. 6, a source/drain region of each transistor is formed by a normal manufacturing process, and a transfer gate TG, a reset transistor (not illustrated), an amplification transistor Amp, and a select transistor (not illustrated) of the pixel transistor portion 13, and a transistor 17 and the like of the peripheral circuit portion 14 are formed in the silicon layer 11.

Furthermore, although not illustrated in the drawing, a protective film 49 is formed on a portion of the front surface side of the silicon layer 11 on which the pixel transistor portion 13 and the peripheral circuit portion 14 are formed, and a plurality of wiring layers is formed on the protective film 49 via an interlayer insulating film. The front surface of the interlayer insulating film on the uppermost layer is planarized, and a support substrate is attached to the front surface. In addition, a protective film 47 is formed on the back surface side of the silicon layer 11, a color filter is formed at a position at which an incident light enters into the photoelectric conversion portion 12, and a microlens that guides the incident light towards the photoelectric conversion portion 12 is formed above the color filter. In this way, a solid-state imaging device 1 is formed.

In the second manufacturing method, the aperture portion 52 exposing the silicon layer 11 is formed at a position to overlap a region in which the photoelectric conversion portion 12 is formed, and the gettering layer 16 is formed by the gate electrode formation film 53 serving as a gettering layer having internal stress in the aperture portion 52. Therefore, strains are provided to the silicon layer 11 by the stress of the gettering layer 16. Strained layers which are formed due to the strains function as gettering sites, thus effectively gettering metal impurities, for example, in the silicon layer 11.

Moreover, since the gate electrode formation film 53 of the pixel transistor portion and the peripheral circuit portion is formed by the same film as the gettering layer 16, it is not necessary to form an additional film for the gettering layer 16, and the number of processing steps is not increased.

Third Example of Solid-State Imaging Device Manufacturing Method

Figure 8:
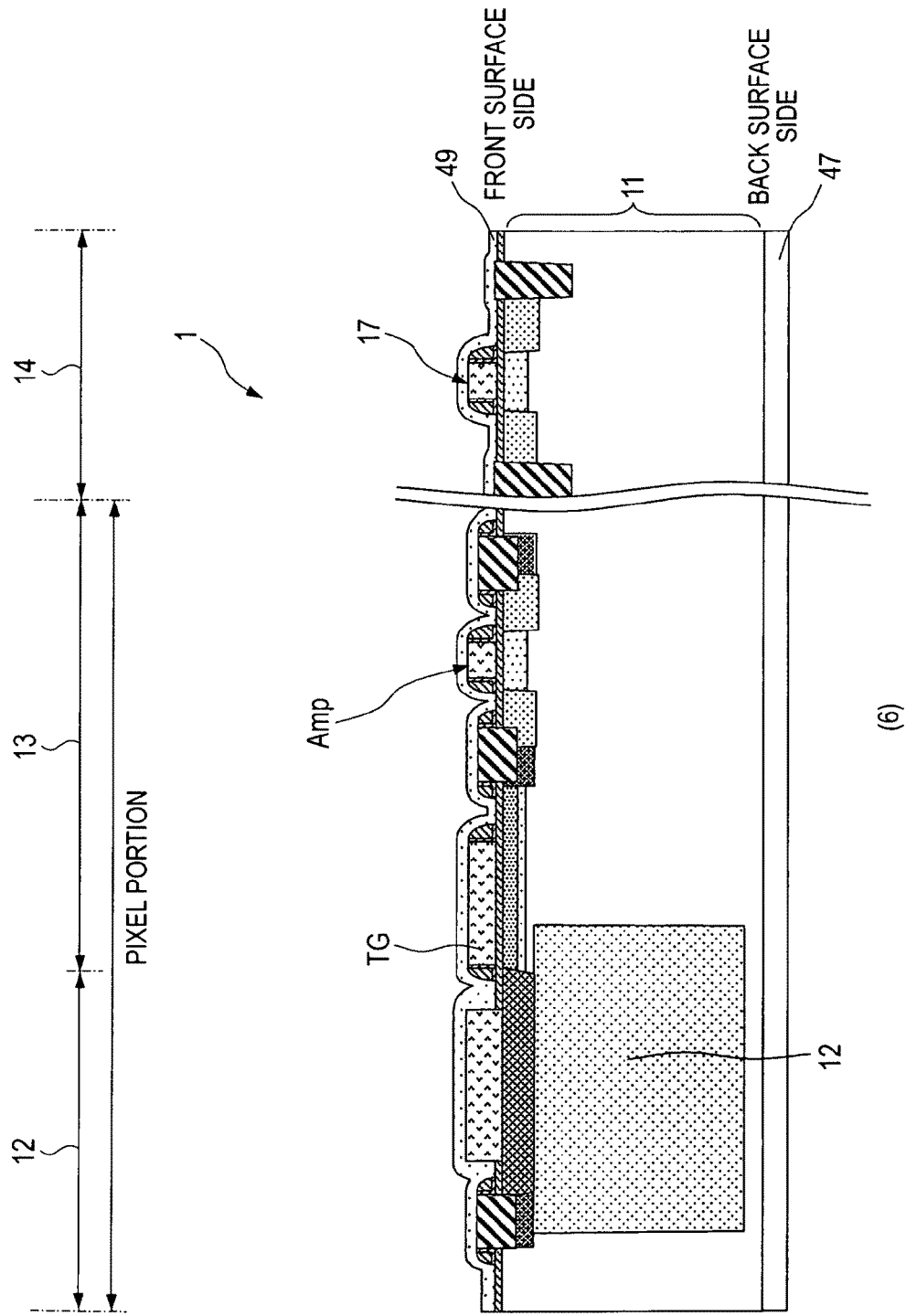
FIG. 8 is a cross-sectional view illustrating the manufacturing process of the third example of the solid-state imaging device manufacturing method according to the third embodiment of the present invention.

A third example of a solid-state imaging device manufacturing method according to a third embodiment of the present invention will be described with reference to the cross-sectional views of FIGS. 7 and 8.

According to the third example (third manufacturing method) of the solid-state imaging device manufacturing method, as illustrated in (1) in FIG. 7, device separation regions 15 are formed in a silicon layer 11 formed of a silicon substrate so as to isolate electrically devices which are formed in a photoelectric conversion portion 12, a pixel transistor portion, and a peripheral circuit portion.

Subsequently, a photoelectric conversion portion 12 that receives an incident light to perform photoelectric conversion on the incident light is formed in the silicon layer 11.

In addition, the third manufacturing method includes a step of forming in the silicon layer 11, a pixel transistor portion that outputs signal charges generated in the photoelectric conversion portion 12 and forming a peripheral circuit portion on the periphery of a pixel portion having the photoelectric conversion portion 12 and the pixel transistor portion.

After the photoelectric conversion portion 12 is formed, a gate insulating film 51 of either a transistor of the pixel transistor portion or a transistor of the peripheral circuit portion is formed on the front surface of the silicon layer 11. When it is desired to form a gate insulating film of a transistor of the pixel transistor portion or the peripheral circuit portion which requires a gate insulating film thicker than the gate insulating film 51, the gate insulating film may be formed in a separate step. Moreover, when the gate insulating film 51 is formed of a silicon oxide film, the gate insulating film may be formed to be thick. An example of this formation method will be described. In this case, the gate insulating film 51 is formed on portions of the silicon layer 11 requiring a thin gate insulating film, and the gate insulating film 51 on portions of the silicon layer 11 requiring a thick gate insulating film is further oxidized in a state of masking the portions requiring the thin gate insulating film, thus making the gate insulating film 51 on those portions thick.

Subsequently, as illustrated in (2) in FIG. 7, a gate electrode formation film 53 is formed on the gate insulating film 51. The gate electrode formation film 53 may be formed of a polysilicon film by a reduced pressure CVD method, for example. Moreover, either or both of N-type impurities and P-type impurities are introduced to necessary locations of the polysilicon film as necessary.

Subsequently, as illustrated in (3) in FIG. 7, gate electrodes of the pixel transistor portion and the peripheral circuit portion are formed by the gate electrode formation film 53 by general lithography technique and etching technique. For example, a transfer gate TG of the pixel transistor portion, a gate electrode (not illustrated) of a reset transistor, and a gate electrode (not illustrated) of an amplification transistor are formed, and at the same time, a gate electrode 19 of a transistor of the peripheral circuit portion is formed.

Subsequently, as illustrated in (4) in FIG. 7, a sidewall formation film 61 is formed so as to cover the transfer gate TG, the gate electrode 19, and the like. Prior to formation of the sidewall formation film 61, an offset spacer (not illustrated) may be formed on the lateral walls of the gate electrode 19, thus forming a so-called extension region in the transistor of the peripheral circuit portion. Moreover, a pocket diffusion layer may be formed. The extension region is formed in a diffusion layer having lower concentration than a source/drain region formed later and the same conductivity as the source/drain region.

Subsequently, as illustrated in (5) in FIG. 7, an aperture portion 62 exposing the silicon layer 11 is formed at a position to overlap a region of the sidewall formation film 61 and the gate insulating film 51 in which the photoelectric conversion portion 12 is formed. The aperture portion 62 is formed by normal lithography technique and extension technique.

Subsequently, a gettering layer (extrinsic gettering layer) 16 having internal stress is formed on a portion of the front surface of the silicon layer 11 disposed below the aperture portion 62. The gettering layer 16 is formed, for example, by a gettering formation layer 43 having internal stress which is formed on the sidewall formation film 61 including an inside of the aperture portion 62. The gettering formation layer 43 is formed of a polysilicon film formed by a reduced pressure CVD method, a silicon nitride film formed by a reduced pressure CVD method, or a metal film.

As an example, a polysilicon film formed by the reduced pressure CVD method has an intrinsic stress value of about −200 MPa at a film thickness of 500 nm, for example. Moreover, a silicon nitride film formed by the reduced pressure CVD method has an intrinsic stress value of about +1 GPa at a film thickness of 300 nm, for example.

Therefore, the polysilicon film or the silicon nitride film will be a film having a sufficient tensile or compressive stress.

Furthermore, the gettering layer 16 may be an amorphous silicon film which is formed by a reduced pressure CVD method.

Furthermore, the gettering layer 16 may be a metal film. For example, a tungsten film or a tantalum film may be used. These films have a diffusion coefficient in single-crystalline silicon (Si), which is much (e.g., by several digits) lower than that of copper, cobalt, nickel, and the like, and have a diffusion coefficient which is also lower than that of molybdenum, titanium, chrome, nickel, ruthenium, and the like. Therefore, it can be said that substantially no tungsten or tantalum will diffuse into single-crystalline silicon.

Therefore, materials which have excellent heat resistance and a low diffusion coefficient and will not cause concern about metal contamination can be used for the gettering layer 16.

Subsequently, as illustrated in (6) in FIG. 8, a diffusion layer of a source/drain region or the like is formed, and a transfer gate TG, a reset transistor (not illustrated), an amplification transistor Amp, and a select transistor (not illustrated) of the pixel transistor portion 13, and a transistor 17 of the peripheral circuit portion 14 are formed.

Furthermore, although not illustrated in the drawing, a protective film 49 is formed on a portion of the front surface side of the silicon layer 11 on which the pixel transistor portion 13 and the peripheral circuit portion 14 are formed, and a plurality of wiring layers is formed on the protective film 49 via an interlayer insulating film. The front surface of the interlayer insulating film on the uppermost layer is planarized, and a support substrate is attached to the front surface. In addition, a protective film 47 is formed on the back surface side of the silicon layer 11, a color filter is formed at a position at which an incident light enters into the photoelectric conversion portion 12, and a microlens that guides the incident light towards the photoelectric conversion portion 12 is formed above the color filter. In this way, a solid-state imaging device 1 is formed.

In the third manufacturing method, the aperture portion 62 exposing the silicon layer 11 is formed at a position to overlap a region in which the photoelectric conversion portion 12 is formed, and the gettering layer 16 is formed by the gettering formation layer 43 having internal stress in the aperture portion 62. Therefore, strains are provided to the silicon layer 11 by the stress of the gettering layer 16. Strained layers which are formed due to the strains function as gettering sites, thus effectively gettering metal impurities, for example, in the silicon layer 11.

Moreover, since the gettering layer 16 is formed in the aperture portion 62 exposing the front surface of the silicon layer 11 in a state where the silicon layer 11 is covered with the sidewall formation film 61, a metal film having large internal stress can be used for the gettering layer 16. Moreover, even when metal is used for the gettering layer 16, since the entire surface of the silicon layer 11 is covered with the sidewall formation film 61, the silicon layer 11 will not be contaminated by metal. Furthermore, since a tungsten film or a tantalum film having a very low diffusion coefficient in the silicon layer 11 is used as the metal film, the silicon layer 11 will not be contaminated by the metal film.

4. Fourth Embodiment

Example of Solid-State Imaging Device Manufacturing Method

An example of a solid-state imaging device manufacturing method according to a fourth embodiment of the present invention will be described with reference to the cross-sectional views of FIGS. 9 and 10.

Figure 9:
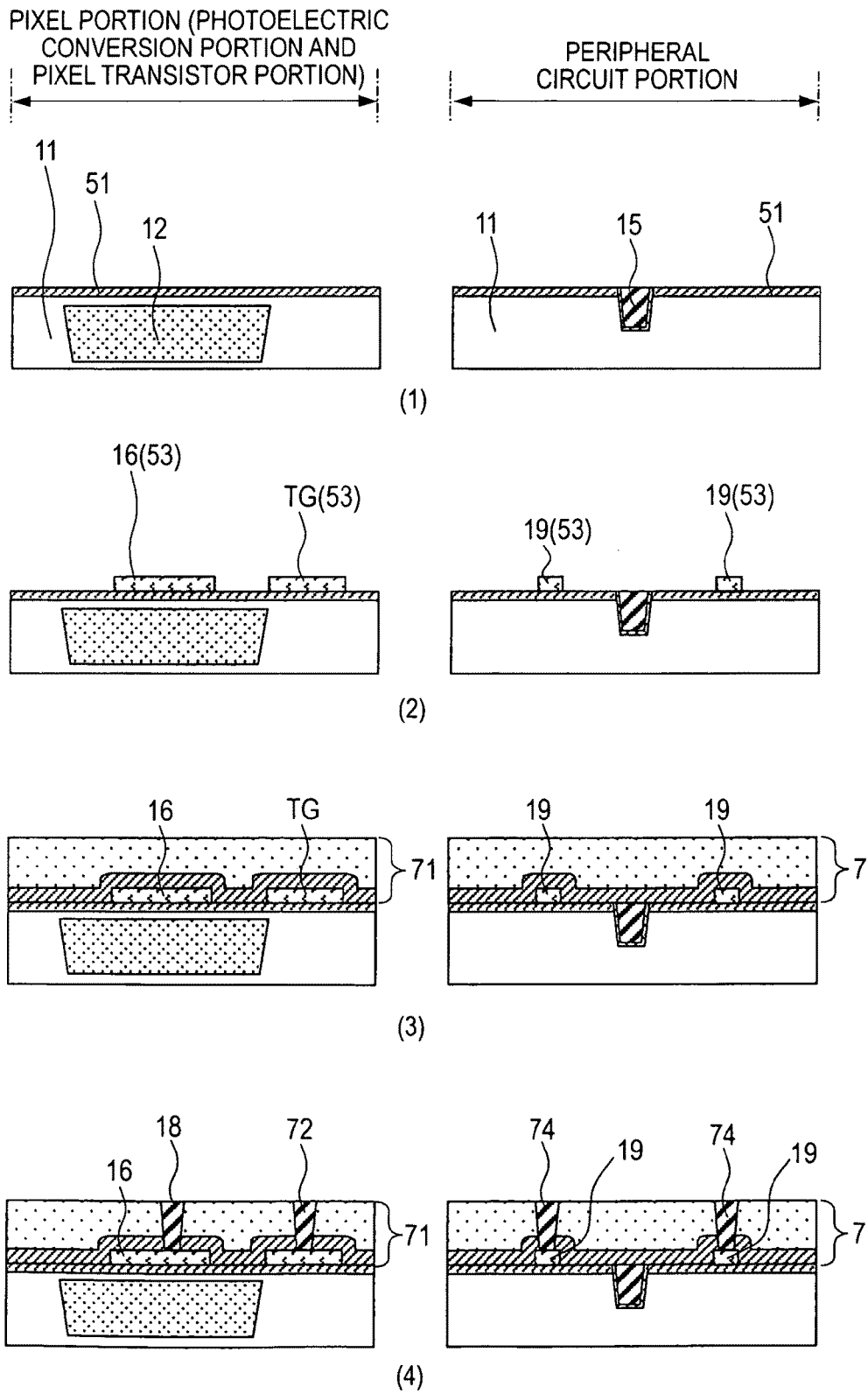
FIG. 9 is a cross-sectional view illustrating the manufacturing process of an example of a solid-state imaging device manufacturing method according to a fourth embodiment of the present invention.
Figure 10:
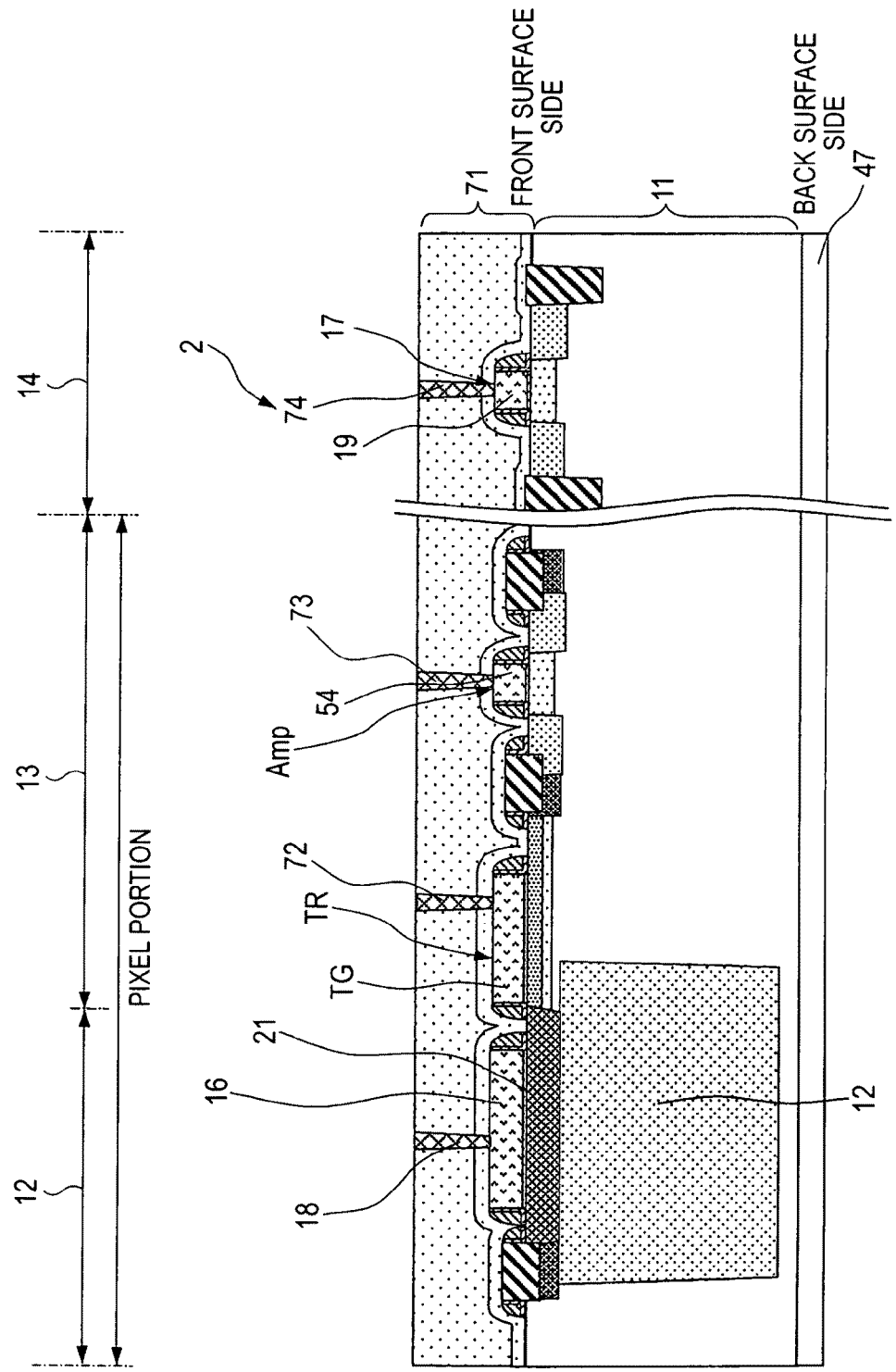
FIG. 10 is a cross-sectional view illustrating the manufacturing process of an example of the solid-state imaging device manufacturing method according to the fourth embodiment of the present invention.

According to the example (fourth manufacturing method) of the solid-state imaging device manufacturing method, as illustrated in (1) in FIG. 9, device separation regions 15 are formed in a silicon layer 11 formed of a silicon substrate so as to isolate electrically devices which are formed in a photoelectric conversion portion, a pixel transistor portion, and a peripheral circuit portion.

Subsequently, a photoelectric conversion portion 12 that receives an incident light to perform photoelectric conversion on the incident light is formed in the silicon layer 11.

In addition, the fourth manufacturing method includes a step of forming in the silicon layer 11, a pixel transistor portion that outputs signal charges generated in the photoelectric conversion portion 12 and forming a peripheral circuit portion on the periphery of a pixel portion having the photoelectric conversion portion 12 and the pixel transistor portion.

After the photoelectric conversion portion 12 is formed, a gate insulating film 51 of either a transistor of the pixel transistor portion or a transistor of the peripheral circuit portion is formed on the front surface of the silicon layer 11. When it is desired to form a gate insulating film of a transistor of the pixel transistor portion or the peripheral circuit portion which requires a gate insulating film thicker than the gate insulating film 51, the gate insulating film may be formed in a separate step. Moreover, when the gate insulating film 51 is formed of a silicon oxide film, the gate insulating film may be formed to be thick. An example of this formation method will be described. In this case, the gate insulating film 51 is formed on portions of the silicon layer 11 requiring a thin gate insulating film, and the gate insulating film 51 on portions of the silicon layer 11 requiring a thick gate insulating film is further oxidized in a state of masking the portions requiring the thin gate insulating film, thus making the gate insulating film 51 on those portions thick.

Subsequently, as illustrated in (2) in FIG. 9, a gate electrode formation film 53 is formed on the gate insulating film 51. The gate electrode formation film 53 may be formed of a polysilicon film by a reduced pressure CVD method, for example. For example, when the polysilicon film is formed of such a polysilicon film, the polysilicon film has a stress value of about −200 MPa, for example. Moreover, either or both of N-type impurities and P-type impurities are introduced to necessary locations of the polysilicon film as necessary.

Subsequently, gate electrodes of the pixel transistor portion and the peripheral circuit portion are formed by the gate electrode formation film 53 by general lithography technique and etching technique. For example, a transfer gate TG of the pixel transistor portion, a gate electrode (not illustrated) of a reset transistor, a gate electrode (not illustrated) of an amplification transistor and a gate electrode of a select transistor are formed, and at the same time, a gate electrode 19 of a transistor of the peripheral circuit portion is formed. At the same time, a gettering layer (extrinsic gettering layer) 16 having internal stress is formed at a position to overlap a region of the gate electrode formation film 53 in which the photoelectric conversion portion 12 is formed.

Subsequently, as illustrated in (3) in FIG. 9 and FIG. 10, a sidewall insulating film, a source/drain region, and the like are formed. Moreover, a transfer gate TG, a reset transistor (not illustrated), an amplification transistor Amp, and the select transistor (not illustrated) of the pixel transistor portion 13, and a transistor 17 and the like of the peripheral circuit portion 14 are formed. (3) in FIG. 9 illustrates a schematic configuration thereof, and FIG. 10 illustrates a detailed configuration thereof.

Subsequently, an insulating film 71 is formed so as to cover the transfer gate TG, the gate electrode 19, the gettering layer 16, and the like. The insulating film 71 is formed in the same manner as a normal interlayer insulating film, and is formed of a silicon oxide film, for example.

Subsequently, as illustrated in (4) in FIG. 9 and FIG. 10, an electrode 18 is formed so as to penetrate the insulating film 71 and be connected to the gettering layer 16, and electrodes 72, 73, and 74 are formed so as to be connected to the transfer gate TG, the gate electrodes 19 and 19, and the like. The electrodes 18, 72, 73, and 74 are formed by a general electrode formation technique after forming connection holes at appropriate positions by general lithography technique and etching technique. The electrodes 18, 72, 73, and 74 may be formed simultaneously with the formation of wirings. (4) in FIG. 9 illustrates a schematic configuration thereof, and FIG. 10 illustrates a detailed configuration thereof. In addition, FIG. 10 illustrates the processing steps illustrated in (3) and (4) in FIG. 9.

Furthermore, although not illustrated in the drawing, a plurality of wiring layers is formed via an interlayer insulating film on a portion of the front surface side of the silicon layer 11 on which the pixel transistor portion 13 and the peripheral circuit portion 14 are formed. The front surface of the interlayer insulating film on the uppermost layer is planarized, and a support substrate is attached to the front surface. In addition, a protective film is formed on the back surface side of the silicon layer 11, a color filter is formed at a position at which an incident light enters into the photoelectric conversion portion 12, and a microlens that guides the incident light towards the photoelectric conversion portion 12 is formed above the color filter. In this way, a solid-state imaging device 2 is formed.

In the fourth manufacturing method, the gettering layer 16 having internal stress is formed by the gate electrode formation film 53 at a position to overlap a region in which the photoelectric conversion portion 12 is formed. Therefore, strains are provided to the silicon layer 11 by the stress of the gettering layer 16. Strained layers which are formed due to the strains function as gettering sites, thus effectively gettering metal impurities, for example, in the silicon layer 11.

Moreover, since the gettering layer 16 is formed on the silicon layer 11 via the gate insulating film 51 and the electrode 18 is connected to the gettering layer 16, a negative potential can be applied to the gettering layer 16 through the electrode 18. In this manner, when a negative potential is applied to the gettering layer 16 through the electrode 18, holes can be electrically accumulated to a portion of the silicon layer 11 at the vicinity of the gettering layer 16, whereby a hole accumulation layer (not illustrated) is formed. The formed hole accumulation layer prevents occurrence of white points in the photoelectric conversion portion 12 and generation of dark current. A voltage of around 1.1 to 1.2 V will suffice for application to the gettering layer 16.

In the manufacturing methods described above, the gettering effect can be selected depending on a step where gettering is applied.

In particular, the gettering effect in the embodiments of the present invention is a phenomenon that depends on a thermal diffusion phenomenon. Therefore, a particularly high gettering effect can be expected when the gettering layer 16 is formed prior to a step which includes a heat treatment process at a high temperature or for a long period of time. In any of the manufacturing methods, since the gettering layer 16 is formed prior to a heat treatment process and after ion implantation which is generally performed at the time of forming transistors, a sufficient gettering effect can be obtained.

Furthermore, the silicon nitride film or the polysilicon film, which is formed by a reduced pressure CVD method, is formed at the time of the formation step of the photoelectric conversion portion 12 by ion implantation or a pixel separation step by ion implantation. By performing the ion implantation over the film, it is possible to expect a secondary advantage that incorporation of contaminated seeds due to the knock-on effect can be prevented.

Next, the silicon layer 11 in the solid-state imaging devices 1 and 2 and the first to fourth manufacturing methods will be described. A structure in which a single-crystalline silicon layer is formed on a base substrate via a silicon oxide layer may be used as the silicon layer 11. That is to say, an SOI substrate can be used.

Example of Manufacturing Method of Solid-State Imaging Device Using SOI Substrate An example of a manufacturing method of a back-illuminated solid-state imaging device according to the embodiment of the present invention, which uses an SOI substrate, will be described with reference to the cross-sectional view of FIG. 11.

Formation of SOI Substrate

Figure 11:
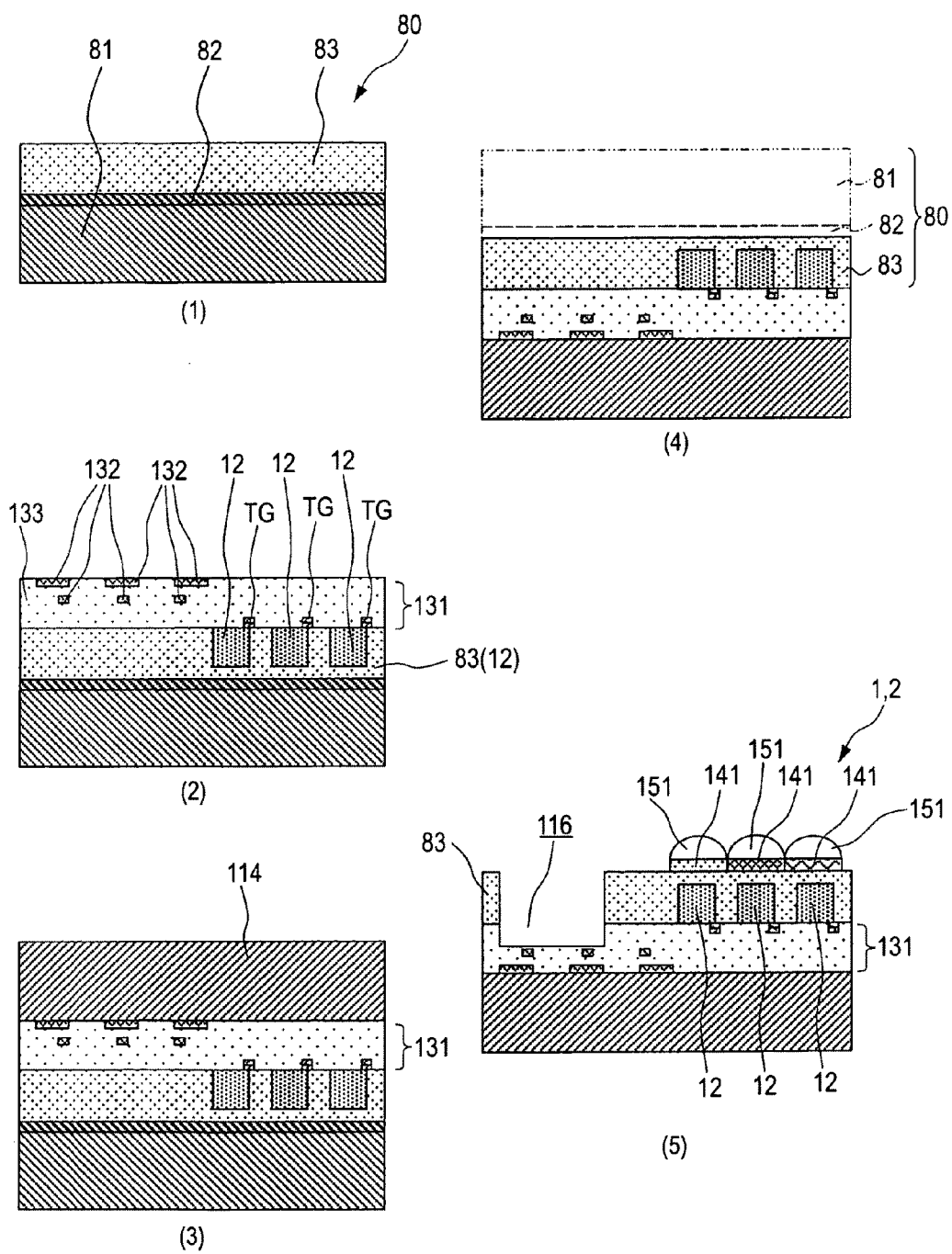
FIG. 11 is a cross-sectional view illustrating the manufacturing process of an example of a manufacturing method of a back-illuminated solid-state imaging device using an SOI substrate according to the embodiment of the present invention.

As illustrated in (1) in FIG. 11, an SOI substrate 80 has a single-crystalline silicon layer 83 having a thickness of several μm which is formed on a base substrate 81 via a silicon oxide layer 82 (BOX layer), considering the photoelectric conversion efficiency at the visible wavelength range.

For example, a thickness of at least 3 μm is necessary in order to form a photoelectric conversion portion in the single-crystalline silicon layer 83.

In particular, a photoelectric conversion portion having sensitivity to long-wavelength light requires a silicon layer having a thickness of around 6 μm. Therefore, by forming the single-crystalline silicon layer 83 to a thickness of about 6 to 8 μm, it is possible to form a photoelectric conversion portion having sensitivity to long-wavelength light.

Formation of Photoelectric Conversion Portion and the Like

Subsequently, as illustrated in (2) in FIG. 11, a photoelectric conversion portion 12, a transfer gate TG, and a peripheral circuit portion (not illustrated) are formed in the single-crystalline silicon layer 83 (corresponding to the silicon layer 11). The manufacturing method according to the embodiment of the present invention can be applied to this step.

Subsequently, a wiring layer 131 is formed on the single-crystalline silicon layer 83. The wiring layer 131 is formed of wirings 132 and an interlayer insulating film 133 covering the wirings 132, for example.

Then, the surface of the interlayer insulating film 133 is planarized. The planarization is performed by CMP (chemical mechanical polishing). In this way, a surface state which is suitable for attaching the surface of the interlayer insulating film 133 to a support substrate is achieved.

A protective film (not illustrated) that is planarized in the described manner may be formed on the interlayer insulating film 133.

Attachment of Support Substrate

Subsequently, as illustrated in (3) in FIG. 11, a support substrate 114 is attached onto the wiring layer 131. A silicon substrate is used for the support substrate 114. Alternatively, a glass substrate or a resin substrate may be used.

The attachment method usable at that time includes adhesion with heat-resistant resin or adhesion by plasma treatment.

Removal of Base Substrate

Subsequently, as illustrated in (4) in FIG. 11, the base substrate 81 (illustrated by two-dot chain line), which is a base member of the SOI substrate 80, is made thin by a mechanical polishing method.

Subsequently, the base substrate 81 being left after the mechanical polishing is removed by chemical treatment (e.g., etching), and the silicon oxide layer 82 (illustrated by two-dot chain line), which constitutes the SOI substrate 80, is removed by the chemical treatment.

As a result, the surface of the single-crystalline silicon layer 83 (active layer), which serves as a photoelectric conversion region, is exposed, and thus a back-illuminated structure is achieved.

Formation of Color Filter and Condensing Lens

Subsequently, as illustrated in (5) in FIG. 11, an aperture portion 116 is formed so that an electrode can be taken out from the side of the single-crystalline silicon layer 83 toward the wiring layer 131 through the aperture portion 116.

A color filter 141 is formed on a portion of the single-crystalline silicon layer 83 disposed on an optical path of light incident to the photoelectric conversion portion 12.

Furthermore, a microlens 151 that guides an incident light towards the photoelectric conversion portion 12 is formed on the color filter 141.

In this way, the solid-state imaging devices 1 and 2 which are stacked full-aperture CMOS sensors are formed.

The silicon layer 11 in the solid-state imaging devices 1 and 2 and the first to fourth manufacturing methods may be formed of a single-crystalline silicon layer which is epitaxially grown on a single-crystalline silicon substrate. That is to say, an epitaxial growth substrate may be used.

Example of Manufacturing Method of Solid-State Imaging Device Using Epitaxial Growth Substrate Subsequently, an example of a manufacturing method of a back-illuminated solid-state imaging device using an epitaxial growth substrate will be described with reference to the cross-sectional view of FIG. 12.

Formation of Silicon Epitaxial Growth Layer

Figure 12:
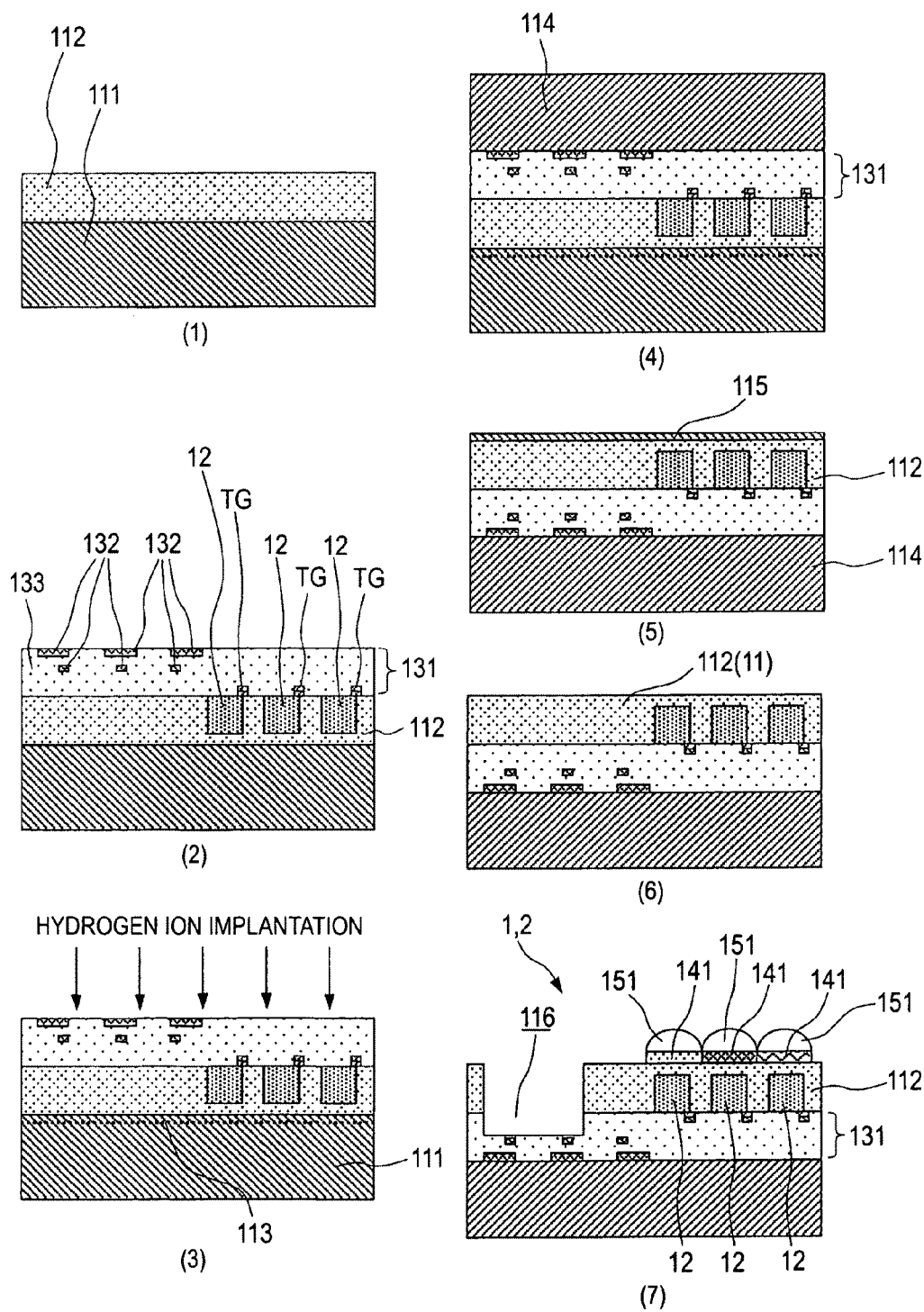
FIG. 12 is a cross-sectional view illustrating the manufacturing process of an example of a manufacturing method of a back-illuminated solid-state imaging device using an epitaxial growth substrate according to the embodiment of the present invention.

As illustrated in (1) in FIG. 12, a silicon substrate 111 is prepared.

Subsequently, a silicon epitaxial growth layer 112 (corresponding to the silicon layer 11) is formed on the silicon substrate 111.

The epitaxial growth involves heating a substrate temperature to 1100° C., for example, and forming a silicon epitaxial growth layer to a thickness of about 8 μm, for example. The thickness of the silicon epitaxial growth layer 112 is appropriately chosen.

For example, a thickness of at least 3 μm is necessary in order to form a photoelectric conversion portion in the silicon epitaxial growth layer 112. In particular, a photoelectric conversion portion having sensitivity to long-wavelength light requires a silicon layer having a thickness of around 6 μm. Therefore, by forming the silicon epitaxial growth layer 112 to a thickness of about 6 to 8 μm, it is possible to form a photoelectric conversion portion having sensitivity to long-wavelength light.

As a raw material gas for silicon used in the silicon epitaxial growth, materials, which are used in the general semiconductor process, may be used, such as, for example, silicon tetrachloride ($SiCl_4$), trichlorosilane ($SiHCl_3$), dichlorosilane ($SiH_2Cl_2$), and monosilane ($SiH_4$). For example, trichlorosilane ($SiHCl_3$) and dichlorosilane ($SiH_2Cl_2$) are used.

The condition for the epitaxial growth may be either an atmospheric pressure CVD method or a reduced pressure CVD method, and the growing temperature is set to a range such as to satisfy crystallinity and productivity.

Formation of Photoelectric Conversion Portion and the Like

Subsequently, as illustrated in (2) in FIG. 12, a photoelectric conversion portion 12, a transfer gate TG, and a peripheral circuit portion (not illustrated) are formed in the silicon epitaxial growth layer 112. The manufacturing method according to the embodiment of the present invention can be applied to this step.

Subsequently, a wiring layer 131 is formed on the silicon epitaxial growth layer 112. The wiring layer 131 is formed of wirings 132 and an interlayer insulating film 133 covering the wirings 132, for example.

Then, the surface of the interlayer insulating film 133 is planarized. The planarization is performed by CMP (chemical mechanical polishing).

In this way, a surface state which is suitable for attaching the surface of the interlayer insulating film 133 to a support substrate is achieved. A protective film (not illustrated) that is planarized in the described manner may be formed on the interlayer insulating film 133.

Formation of Split Layer

Subsequently, as illustrated in (3) in FIG. 12, a split layer 113 is formed in the silicon substrate 111 by ion implantation. For example, the split layer 113 is formed such that delamination of the silicon substrate 111 can be achieved in a subsequent step within a range of depths of 0.1 to 1 μm, for example, from the side of the silicon substrate 111.

In the ion implantation, the split layer 13 which is weak and serves as a split surface is formed by implanting hydrogen ions.

For example, the ion implantation condition is set so that a project range (Rp) of hydrogen is less than 1 μm at implantation energy of several hundreds of keV.

In the ion implantation, impurities other than hydrogen may be used. For example, inactive atoms such as helium (He) may be used.

As an example of the ion implantation condition, a dose amount is set to a range of $5 \times 10^{16}/cm^2$ to $1 \times 10^{17}/cm^2$, and the implantation energy is set to 300 keV or lower (an intensity corresponding to a project range, Rp=3 μm). This condition is an example and can be appropriately set in accordance with the depth to which the split layer 113 is formed.

In the embodiment of the present invention, the implantation energy is preferably in the range of 1 MeV or less, considering the photoelectric conversion efficiency at the long-wavelength range, particularly, at the visible wavelength range. At this time, it is necessary to consider a range of thicknesses of the front surface of a silicon layer to be polished, the silicon layer being formed from the silicon substrate 111 left on the side of the support substrate after the silicon substrate 111 is delaminated.

Attachment of Support Substrate

Subsequently, as illustrated in (4) in FIG. 12, a support substrate 114 is attached onto the wiring layer 131.

A silicon substrate is used for the support substrate 114. Alternatively, a glass substrate or a resin substrate may be used.

The attachment method usable at that time includes adhesion with heat-resistant resin or adhesion by plasma treatment.

Delamination of Silicon Substrate

Subsequently, as illustrated in (5) in FIG. 12, a side of the split layer 113 (see (3) in FIG. 12) close to the silicon substrate 111 (see (3) in FIG. 12) is delaminated.

As a result, a silicon film 115 formed from the silicon substrate 111 is formed on a side of the silicon epitaxial growth layer 112 close to the support substrate 114.

The delamination of the silicon substrate 111 is carried out by thermal impact using heat treatment at a temperature of less than 400° C., for example. Alternatively, the delamination may be carried out by application of physical impact using nitrogen ($N_2$) blowing or a jet stream of pure water.

In this manner, treatment can be achieved at a temperature of 400° C. or lower.

Since the split layer 113 which is formed by volume expansion of implanted ions during the ion implantation is a weak layer, the silicon substrate 111 can be easily delaminated at the split layer 113.

Planarization Process

Subsequently, as illustrated in (6) in FIG. 12, the front surface (split surface) of the silicon film 115 (see (5) in FIG. 12) is subjected to a planarization process. The planarization process is performed by hydrogen annealing and polishing, for example. The polishing uses CMP (chemical mechanical polishing), for example.

At this time, as illustrated in the drawing, the silicon film 115 is removed so as to expose the surface of the silicon epitaxial growth layer 112.

In this way, processing is performed to improve the roughness of the surface of the silicon epitaxial growth layer 112 (the silicon layer 11) to be used as a light receiving surface.

Formation of Color Filter and Condensing Lens

Subsequently, as illustrated in (7) in FIG. 12, an aperture portion 116 is formed so that an electrode can be taken out from the side of the silicon epitaxial growth layer 112 toward the wiring layer 131 through the aperture portion 116. A color filter layer 141 is formed on a portion of the silicon epitaxial growth layer 112 disposed on an optical path of light incident to the photoelectric conversion portion 12.

Furthermore, a microlens 151 that guides an incident light towards the photoelectric conversion portion 12 is formed on the color filter 141.

In this way, the solid-state imaging devices 1 and 2 which are stacked full-aperture CMOS sensors are formed.

Next, an example of the positional relationship between the gettering layer 16 and the photoelectric conversion portion 12 in the solid-state imaging devices 1 and 2 according to the embodiment of the present invention will be described with reference to the plan view layout diagrams of FIGS. 13 and 14.

Figure 13:
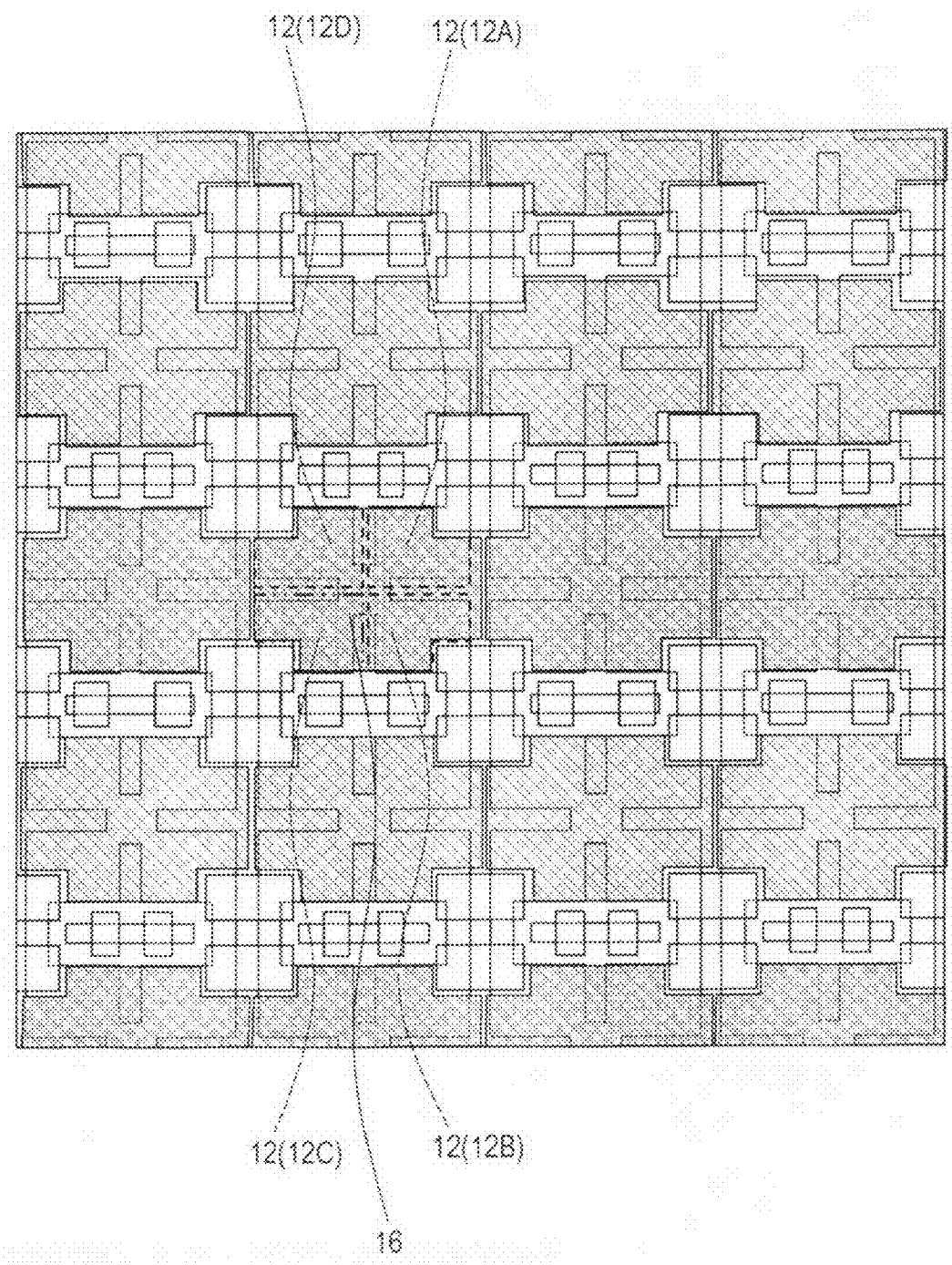
FIG. 13 is a plan view layout diagram illustrating an example of the positional relationship between a gettering layer and a photoelectric conversion portion in the solid-state imaging device according to the embodiment of the present invention.

The example illustrated in FIG. 13 is a so-called 4-pixel sharing structure, in which one gettering layer 16 is formed and provided for four photoelectric conversion portions (12A, 12B, 12C, and 12D).

Figure 14:
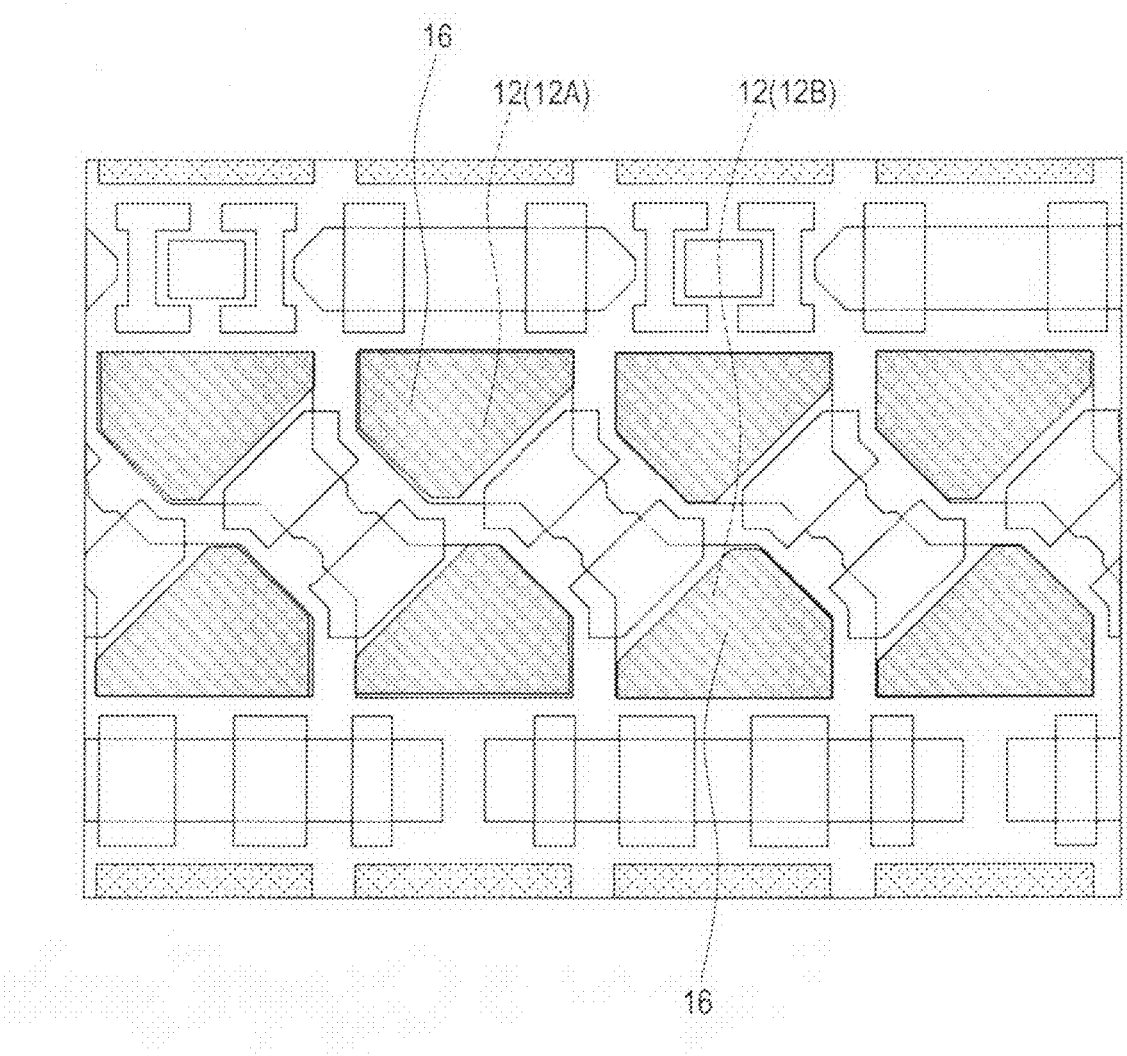
FIG. 14 is a plan view layout diagram illustrating an example of the positional relationship between a gettering layer and a photoelectric conversion portion in the solid-state imaging device according to the embodiment of the present invention.

The example illustrated in FIG. 14 is a so-called 2-pixel sharing structure, in which one gettering layer 16 is formed and provided for each of two photoelectric conversion portions 12 (12A and 12B).

In either case, the gettering layer 16 is formed at a position to overlap the photoelectric conversion portion 12 on a plan view layout in a substrate surface thereof. Similar to the above example, the gettering layer 16 may be laid out at a position to perfectly overlap the photoelectric conversion portion 12.

5. Fifth Embodiment

Exemplary Configuration of Imaging Apparatus

An exemplary configuration of an imaging apparatus according to a fifth embodiment of the present invention will be described with reference to the block diagram of FIG. 15.

Figure 15:
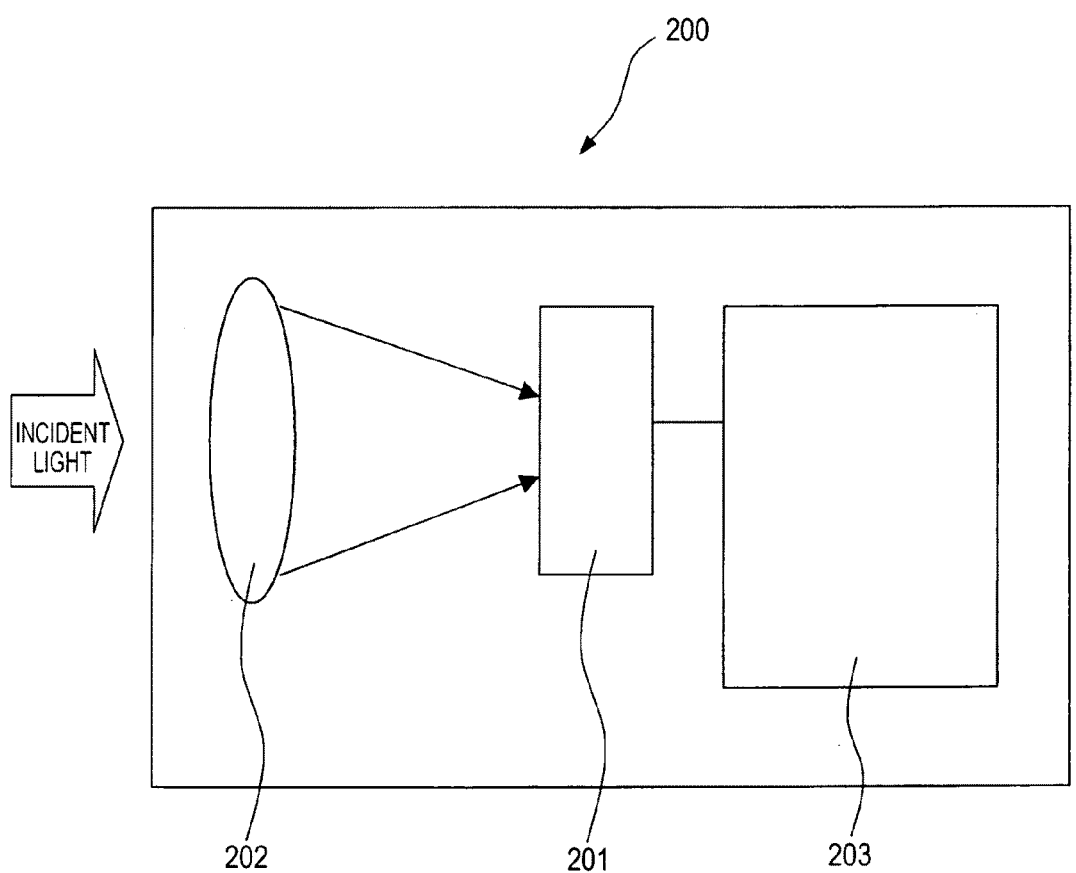
FIG. 15 is a block diagram illustrating an exemplary configuration of an imaging apparatus according to a fifth embodiment of the present invention.
Figure 16:
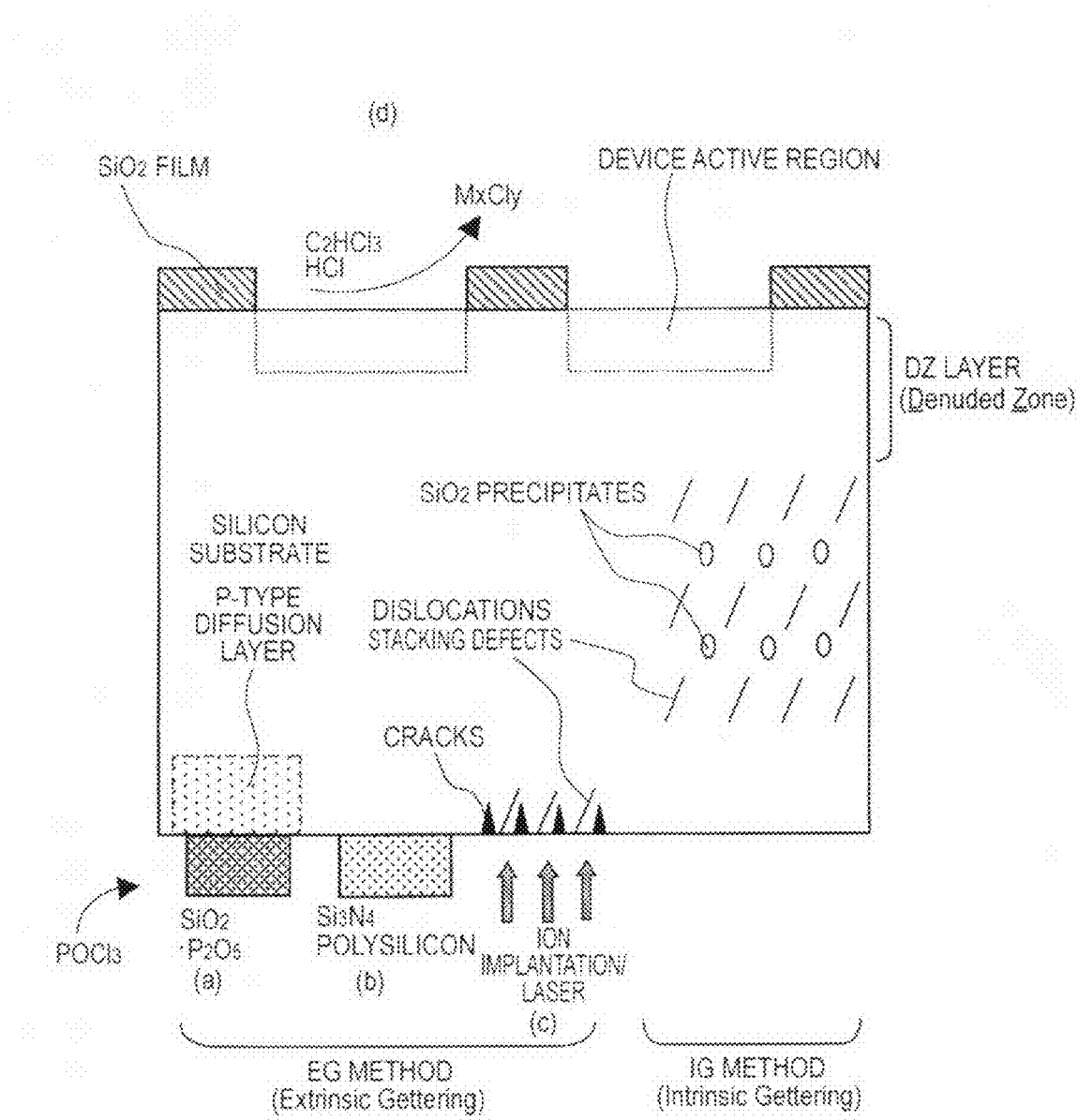
FIG. 16 is a diagram for describing a gettering technique.
Figure 17:
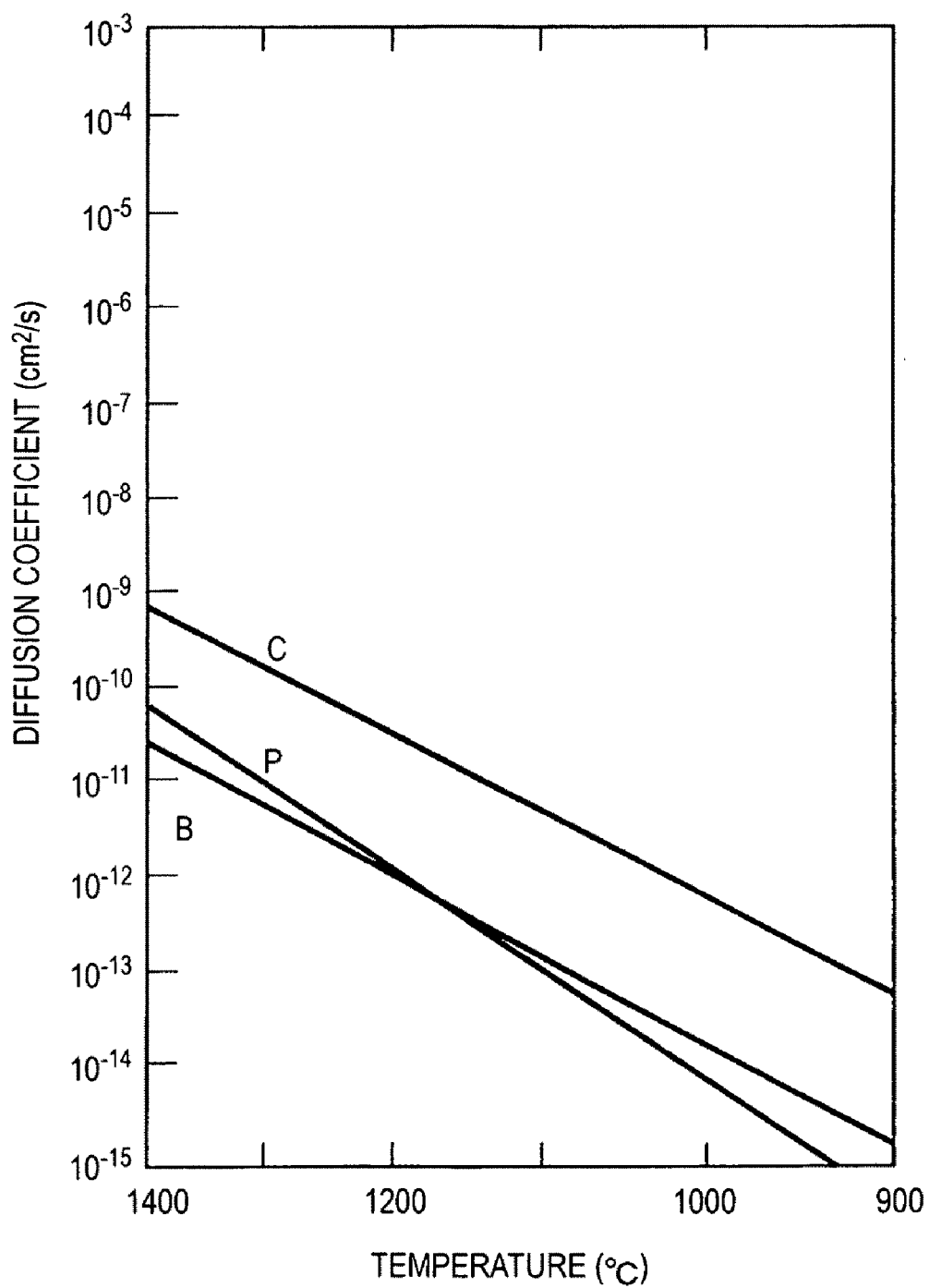
FIG. 17 is a graph illustrating the relationship between a diffusion coefficient of carbon and temperature.

As illustrated in FIG. 15, an imaging apparatus 200 is provided with a solid-state imaging device (not illustrated) in an imaging unit 201. A light-condensing optical unit 202 that condenses an image is provided on a light condensing side of the imaging unit 201. Moreover, the imaging unit 201 is connected to a signal processing portion 203 that includes a driving circuit for driving the imaging unit 201, a signal processing circuit for processing signals having been subjected to photoelectric conversion in the solid-state imaging device to obtain image signals, and other circuits. Moreover, the image signals processed by the signal processing portion 203 are stored in an image storage unit (not illustrated). In such an imaging apparatus 200, the solid-state imaging device may be a solid-state imaging device formed by the above-described manufacturing method.

Since the imaging apparatus 200 uses the solid-state imaging device formed by the manufacturing method according to the embodiment of the present invention, it is possible to adjust the spectral balance of the solid-state imaging device. Therefore, an image combination margin can be secured when adjusting images to near-natural colors, and thus color correction is made easy. Thus, it is possible to provide an advantage that images with excellent color reproducibility can be obtained.

The imaging apparatus 200 may have a form such that it is formed into a one-chip configuration and may have a modular form having an imaging function in which the imaging unit and the signal processing portion or the optical unit are packaged. Moreover, the solid-state imaging device according to the embodiment of the present invention may be applied to such an imaging apparatus. Here, the imaging apparatus refers to, for example, a camera or portable equipment having an imaging function. Moreover, "imaging" is meant to include not only capturing of an image at the time of general camera shooting but also detection of fingerprints and the like in a broader sense of its meaning.

What is claimed is:

1. A solid-state imaging device comprising:
   a photoelectric conversion portion that receives an incident light from a back surface side of a silicon layer to perform photoelectric conversion on the incident light; and
   a pixel transistor portion that outputs signal charges generated in the photoelectric conversion portion towards a front surface side of the silicon layer, wherein
   a gettering layer having internal stress is provided on the front surface side of the silicon layer at a position to overlap the photoelectric conversion portion on a plan view layout in a substrate surface thereof.

2. The solid-state imaging device according to claim 1, wherein the gettering layer is formed directly on the front surface of the silicon layer.

3. The solid-state imaging device according to claim 1, wherein
   the gettering layer is formed on the silicon layer via a gate insulating film; and
   a negative potential is applied to the gettering layer.

4. The solid-state imaging device according to claim 3, wherein the gate insulating film is formed by a gate insulating film which is at the same layer as either a gate insulating film of a transistor of the pixel transistor portion or a gate insulating film of a transistor of a peripheral circuit portion which is formed on the periphery of a pixel portion having the photoelectric conversion portion and the pixel transistor portion.

5. An imaging apparatus comprising:
   a light-condensing optical unit that condenses an incident light;
   an imaging unit having a solid-state imaging device which receives the light condensed by the light-condensing optical unit and performs photoelectric conversion on the light; and
   a signal processing portion that processes signals having been subjected to the photoelectric conversion, the solid-state imaging device including:
   a photoelectric conversion portion that receives an incident light from a back surface side of a silicon layer to perform photoelectric conversion on the incident light; and
   a pixel transistor portion that outputs signal charges generated in the photoelectric conversion portion towards a front surface side of the silicon layer, wherein
   a gettering layer having internal stress is provided on the front surface side of the silicon layer at a position to overlap the photoelectric conversion portion on a plan view layout in a substrate surface thereof.

* * * * *